(12) United States Patent
Yoneya et al.

(10) Patent No.: US 7,786,827 B2
(45) Date of Patent: Aug. 31, 2010

(54) SURFACE ACOUSTIC WAVE DEVICE, TRANSMITTER, AND TRANSCEIVER

(75) Inventors: Katsuro Yoneya, Azumino (JP); Shinji Nishio, Suwa (JP); Masahiro Onuki, Fujisawa (JP)

(73) Assignee: Epson Toyocom Corporation, Tokyo (JP)

(*) Notice: Subject to any disclaimer, the term of this patent is extended or adjusted under 35 U.S.C. 154(b) by 160 days.

(21) Appl. No.: 11/987,364

(22) Filed: Nov. 29, 2007

(65) Prior Publication Data

US 2008/0122558 A1 May 29, 2008

(30) Foreign Application Priority Data

Nov. 29, 2006 (JP) ............................. 2006-321245
Nov. 30, 2006 (JP) ............................. 2006-323086
Nov. 30, 2006 (JP) ............................. 2006-323087

(51) Int. Cl.
*H03H 9/64* (2006.01)
*H03B 5/32* (2006.01)

(52) U.S. Cl. .................. 333/195; 333/193; 310/313 D; 331/107 A

(58) Field of Classification Search ......... 333/193–196; 310/313 B, 313 D; 331/107 A
See application file for complete search history.

(56) References Cited

U.S. PATENT DOCUMENTS 4,247,835 A * 1/1981 Lewis ......................... 333/155
4,897,621 A * 1/1990 Masuda ................... 331/107 A
5,523,722 A * 6/1996 Nakano et al. ........... 331/107 A
7,456,710 B2 * 11/2008 Yoneya ....................... 333/195

FOREIGN PATENT DOCUMENTS

| JP | A-01-252016 | 10/1989 |
| JP | B2-2925158 | 5/1999 |
| JP | A-2005-303357 | 10/2005 |
| JP | A-2005-303359 | 10/2005 |
| JP | A-2006-067119 | 3/2006 |
| JP | A-2006-067120 | 3/2006 |

* cited by examiner

*Primary Examiner*—Barbara Summons
(74) *Attorney, Agent, or Firm*—Oliff & Berridge, PLC

(57) ABSTRACT

A surface acoustic wave device comprises a surface acoustic wave element, including: a piezoelectric substrate, a first interdigital transducer unit having a first interdigital transducer and a second interdigital transducer formed on the piezoelectric substrate, and a second interdigital transducer unit having a third interdigital transducer and a fourth interdigital transducer formed on the piezoelectric substrate; a first terminal electrically coupled to the first interdigital transducer; a second terminal electrically coupled to the second interdigital transducer; a first variable resistor electrically coupling the first terminal to the third interdigital transducer; a second variable resistor electrically coupling the first terminal to the fourth interdigital transducer; a third variable resistor electrically coupling the second terminal to the third interdigital transducer; and a fourth variable resistor electrically coupling the second terminal to the fourth interdigital transducer.

10 Claims, 19 Drawing Sheets

THIRD STATE (A) FIRST STATE (B) SECOND STATE (C) THIRD STATE (A) PLAN VIEW (B) SECTIONAL VIEW

SURFACE ACOUSTIC WAVE DEVICE, TRANSMITTER, AND TRANSCEIVER

BACKGROUND

1. Technical Field

The present invention relates to a surface acoustic wave device, a transmitter, and a transceiver.

2. Related Art

As disclosed in JP-A-1-252016, a surface acoustic wave element SD100 shown in FIG. 20A is a surface acoustic wave element in related art. The surface acoustic wave element SD100 includes a piezoelectric substrate SB100 having a first interdigital transducer CE101 and a second interdigital transducer CE102 as a pair, a third interdigital transducer CE103 and a fourth interdigital transducer CE104 as a pair corresponding to the first interdigital transducer CE101 and the second interdigital transducer CE102, and a first reflector RF101 and a second reflector RF102 as a pair formed in a position to sandwich the first interdigital transducer CE101 through the fourth interdigital transducer CE104 thereon.

Now, usage of the surface acoustic wave element SD100 having a configuration as above will be described. As shown in FIG. 20A, an alternating input signal Sin is applied from a terminal T101a and a terminal 101b so as to excite an surface acoustic wave. More particularly, the alternating input signal Sin is applied so that a first voltage relation between the first interdigital transducer CE101 and the second interdigital transducer CE102 is in-phase with a second voltage relation between the third interdigital transducer CE103 and the fourth interdigital transducer CE104. Accordingly, the piezoelectric substrate SB100 oscillates so that a displacement distribution is in a mode S0, thereby generating a resonance signal Sout (S0) corresponding to the mode S0 and having a first frequency. The resonance signal Sout (S0) is thus taken out from a detector (not shown) such as a current-voltage conversion circuit coupled to the terminals T101a and T101b. FIG. 20A shows a case where a voltage of the terminal T101a is positive while a voltage of the terminal T101b is negative.

In contrast to the above, as shown in FIG. 20B, in a case where the alternating input signal Sin is applied so that the first voltage relation and the second voltage relation are in reverse phase, the piezoelectric substrate SB100 oscillates so that the displacement distribution is in a mode A0. As a result, a resonance signal Sout corresponding to the mode A0 and having a second frequency that is higher than the first frequency is generated, thereby a resonance signal Sout (A0) is taken out.

However, in the method to use the surface acoustic wave element SD100 in related art described as above, only two resonance signals that are the resonance signal Sout having the first frequency corresponding to the mode S0, and the resonance signal Sout having the second frequency corresponding to the mode A0 are taken out. Therefore, resonance signals having other frequencies cannot be taken out.

SUMMARY

An advantage of the invention is to provide a surface acoustic wave device, a transmitter, and a transceiver allowing a resonance signal having a frequency other than the first and second frequencies to be taken out.

A surface acoustic wave device according to a first aspect of the invention comprises a surface acoustic wave element including a piezoelectric substrate, a first interdigital transducer unit having a first interdigital transducer and a second interdigital transducer formed on the piezoelectric substrate, and a second interdigital transducer unit having a third interdigital transducer and a fourth interdigital transducer formed on the piezoelectric substrate; a first terminal electrically coupled to the first interdigital transducer; a second terminal electrically coupled to the second interdigital transducer; a first variable resistor electrically coupling the first terminal to the third interdigital transducer; a second variable resistor electrically coupling the first terminal to the fourth interdigital transducer; a third variable resistor electrically coupling the second terminal to the third interdigital transducer; and a fourth variable resistor electrically coupling the second terminal to the fourth interdigital transducer.

The surface acoustic wave device as above may further include a switching unit, the switching unit switching among a first state, a second state, and a third state. The first state is that a resistance value of the first variable resistor and a resistance value of the fourth variable resistor are made to be substantially zero, while a resistance value of the second variable resistor and a resistance value of the third variable resistor are made to be larger than zero so as to make a resonance frequency of the surface acoustic wave element be a first frequency. The second state is that the resistance value of the first variable resistor and the resistance value of the fourth variable resistor are made to be larger than zero, while the resistance value of the second variable resistor and the resistance value of the third variable resistor are made to be substantially zero so as to make the resonance frequency of the surface acoustic wave element be a second frequency. Further, the third state is that the resistance value of the first variable resistor, the resistance value of the second variable resistor, the resistance value of the third variable resistor, and the resistance value of the fourth variable resistor are made to be larger than zero so as to make the resonance frequency of the surface acoustic wave element be a third frequency.

The surface acoustic wave device as above may further include a switching unit, the switching unit switching among a fourth state, a fifth state, and a sixth state. The fourth state is that a resistance value of the first variable resistor and a resistance value of the fourth variable resistor are made to be substantially zero, while a resistance value of the second variable resistor and a resistance value of the third variable resistor are made to be larger than a critical resistance value so as to make a resonance frequency of the surface acoustic wave element be a first frequency. The fifth state is that the resistance value of the first variable resistor and the resistance value of the fourth variable resistor are made to be larger than the critical resistance value, while the resistance value of the second variable resistor and the resistance value of the third variable resistor are made to be substantially zero so as to make the resonance frequency of the surface acoustic wave element be a second frequency. Further, the sixth state is that the resistance value of the first variable resistor, the resistance value of the second variable resistor, the resistance value of the third variable resistor, and the resistance value of the fourth variable resistor are made to be larger than the critical resistance value so as to make the resonance frequency of the surface acoustic wave element be a third frequency.

In this case, the surface acoustic wave device may further include one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

A surface acoustic wave device according to a second aspect of the invention includes a surface acoustic wave element including a piezoelectric substrate, a first interdigital transducer unit having a first interdigital transducer and a second interdigital transducer formed on the piezoelectric substrate; and a second interdigital transducer unit having a third interdigital transducer and a fourth interdigital transducer formed on the piezoelectric substrate; a first terminal electrically coupled to the first interdigital transducer and the fourth interdigital transducer; a second terminal electrically coupled to the second interdigital transducer and the third interdigital transducer; a first resistance element interposed between the first terminal and one of the third interdigital transducer and the fourth interdigital transducer; a second resistance element interposed between the second terminal and the fourth interdigital transducer if the first resistance element is interposed between the first terminal and the third interdigital transducer, while interposed between the second terminal and the third interdigital transducer if the first resistance element is interposed between the first terminal and the fourth interdigital transducer.

In this case, the surface acoustic wave device may further include one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

A surface acoustic wave device according to a third aspect of the invention includes a surface acoustic wave element including a piezoelectric substrate, a first interdigital transducer unit having a first interdigital transducer and a second interdigital transducer formed on the piezoelectric substrate, and a second interdigital transducer unit having a third interdigital transducer and a fourth interdigital transducer formed on the piezoelectric substrate; a first terminal; a second terminal; a first switch electrically coupling the first terminal to one of the third interdigital transducer, the fourth interdigital transducer, and an open end; a second switch electrically coupling the second terminal to one of the fourth interdigital transducer, the third interdigital transducer, and an open end; a switch controller controlling the first switch and the second switch so as to be in one of a seventh state, an eighth state, and a ninth state. The seventh state is that the first switch electrically couples the first terminal to the third interdigital transducer while the second switch electrically couples the second terminal to the fourth interdigital transducer. The eighth state is that the first switch electrically couples the first terminal to the fourth interdigital transducer while the second switch electrically couples the second terminal to the third interdigital transducer. Further, the ninth state is that the first switch couples the first terminal to the open end while the second switch couples the second terminal to the open end.

In this case, the surface acoustic wave device may further include one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

According to the above, by adjusting the resistance value as above or switching the coupling states, a surface acoustic wave device enabling outputting a signal having a desired resonance frequency can be obtained.

A transmitter according to a fourth aspect of the invention provided with the surface acoustic wave device as above includes an oscillator having the surface acoustic wave device and an amplifier coupled to the first terminal and the second terminal of the surface acoustic wave device; a frequency modulation circuit switching between the seventh state and the eighth state by the switch controller of the surface acoustic wave device based on a transmitting data signal, and receiving a resonance signal of the oscillator and outputting a frequency modulation signal; and an amplitude modulation circuit switching the first switch and the second switch to be in the ninth state by the switch controller of the surface acoustic wave device, and receiving the resonance signal being output from the oscillator and outputting an amplitude modulation signal by modulating an amplitude based on the transmitting data signal.

Consequently, the amplitude is modulated by the third frequency generated by the oscillator and positioned between the first and second frequencies. Therefore, all the signals with the modulated amplitude pass through the reception filter letting through the band from the first carrier wave to the second carrier wave, thereby transmitting the data without loosing any part thereof A transceiver according to a fifth aspect of the invention provided with the surface acoustic wave device as above includes: an oscillator having the surface acoustic wave device and an amplifier coupled to the first terminal and the second terminal of the surface acoustic wave device; a frequency modulation circuit switching between the seventh state and the eighth state by the switch controller of the surface acoustic wave device based on a transmitting data signal, and receiving a resonance signal of the oscillator and outputting a frequency modulation signal; an orthogonal detector circuit switching the first switch and the second switch to be in the ninth state by the switch controller of the surface acoustic wave device, and receiving the resonance signal being output from the oscillator and outputting a demodulation signal by orthogonal detection based on a receiving data signal.

Accordingly, three carrier waves are generated by one oscillator. Unlike related art, two or more of oscillators are not required, thereby providing a transceiver achieving downsizing and low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a surface acoustic wave device, a transmitter, and a transceiver according to the invention now will be described with reference to accompanying drawings.

First Embodiment

Figure 1:
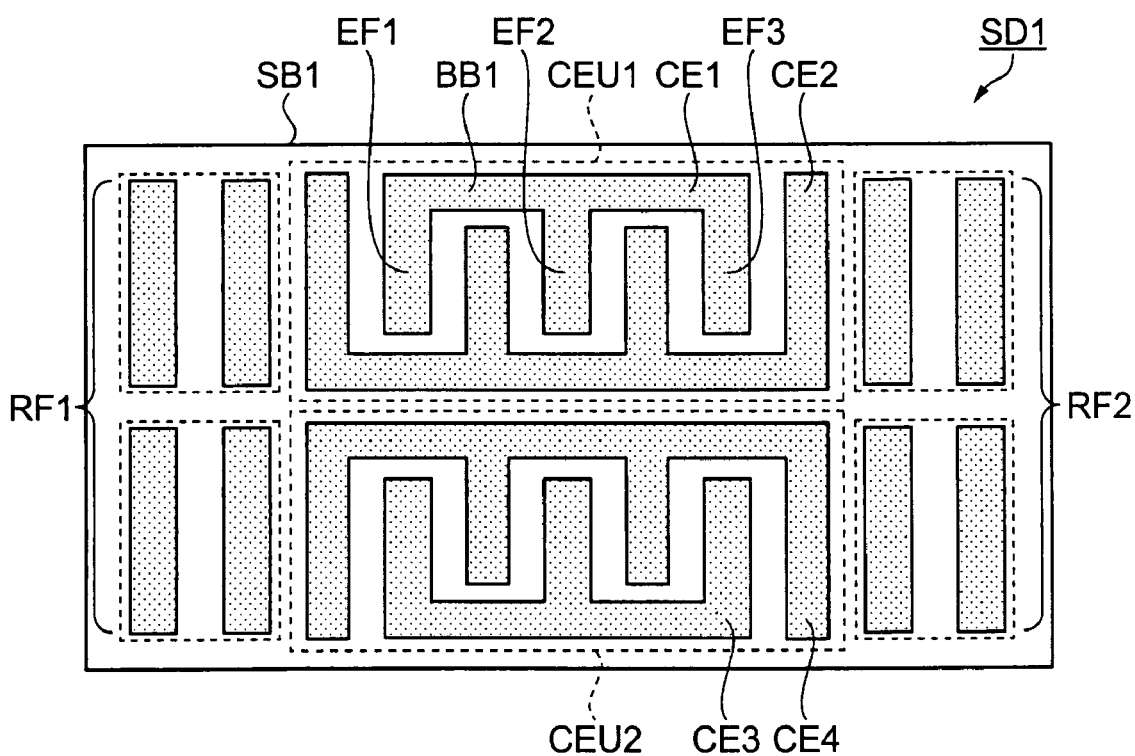
FIG. 1 is a diagram showing a configuration of a surface acoustic wave element according to a first embodiment.

FIG. 1 shows a configuration of a surface acoustic wave element according to a first embodiment. As shown in FIG. 1, a surface acoustic wave element SD1 according to the first embodiment includes a piezoelectric substrate SB1, a first interdigital transducer unit CEU1 and a second interdigital transducer unit CEU2, and a first reflector RF1 and a second reflector RF2.

The piezoelectric substrate SB1 is an in-plane rotated ST cut quartz plate that is operable with a Rayleigh wave type surface acoustic wave.

The first interdigital transducer unit CEU1 and the second interdigital transducer unit CEU2 are positioned adjacent to each other so as to be perpendicular to a propagation direction of a surface acoustic wave. Further, the first interdigital transducer unit CEU1 and the second interdigital transducer unit CEU2 are positioned close enough to each other so that the surface acoustic wave element SD1 can excite a laterally coupled surface acoustic wave. The first interdigital transducer unit CEU1 includes a first interdigital transducer CE1 and a second interdigital transducer CE2 as a pair while the second interdigital transducer unit CEU2 includes a third interdigital transducer CE3 and a fourth interdigital transducer CE4 as a pair. The first interdigital transducer CE1 is provided with three electrode fingers EF1, EF2, and EF3, and a bus bar BB1 electrically coupling the electrode fingers EF1 through EF3. The electrode fingers EF1 through EF3 extend in an across-the-width direction of the piezoelectric substrate SB1, and are periodically positioned toward a longitudinal direction of the piezoelectric substrate SB1, that is the propagation direction of the surface acoustic wave. From a view of a physical configuration (position and shape) and an electrical function, the first interdigital transducer CE1 corresponds to the third interdigital transducer CE3, while the second interdigital transducer CE2 corresponds to the fourth interdigital transducer CE4. More specifically, in the position in the longitudinal direction of the piezoelectric substrate SB1, the electrode fingers of the first interdigital transducer CE1 respectively correspond to the electrode fingers of the third interdigital transducer CE3. Further, in the position in the longitudinal direction of the piezoelectric substrate SB1, the electrode fingers of the second interdigital transducer CE2 respectively correspond to the electrode fingers of the fourth interdigital transducer CE4.

The first reflector RF1 and the second reflector RF2 are formed in a position to sandwich the first interdigital transducer unit CEU1 and the second interdigital transducer unit CEU2 on the piezoelectric substrate SB1.

Figure 2:
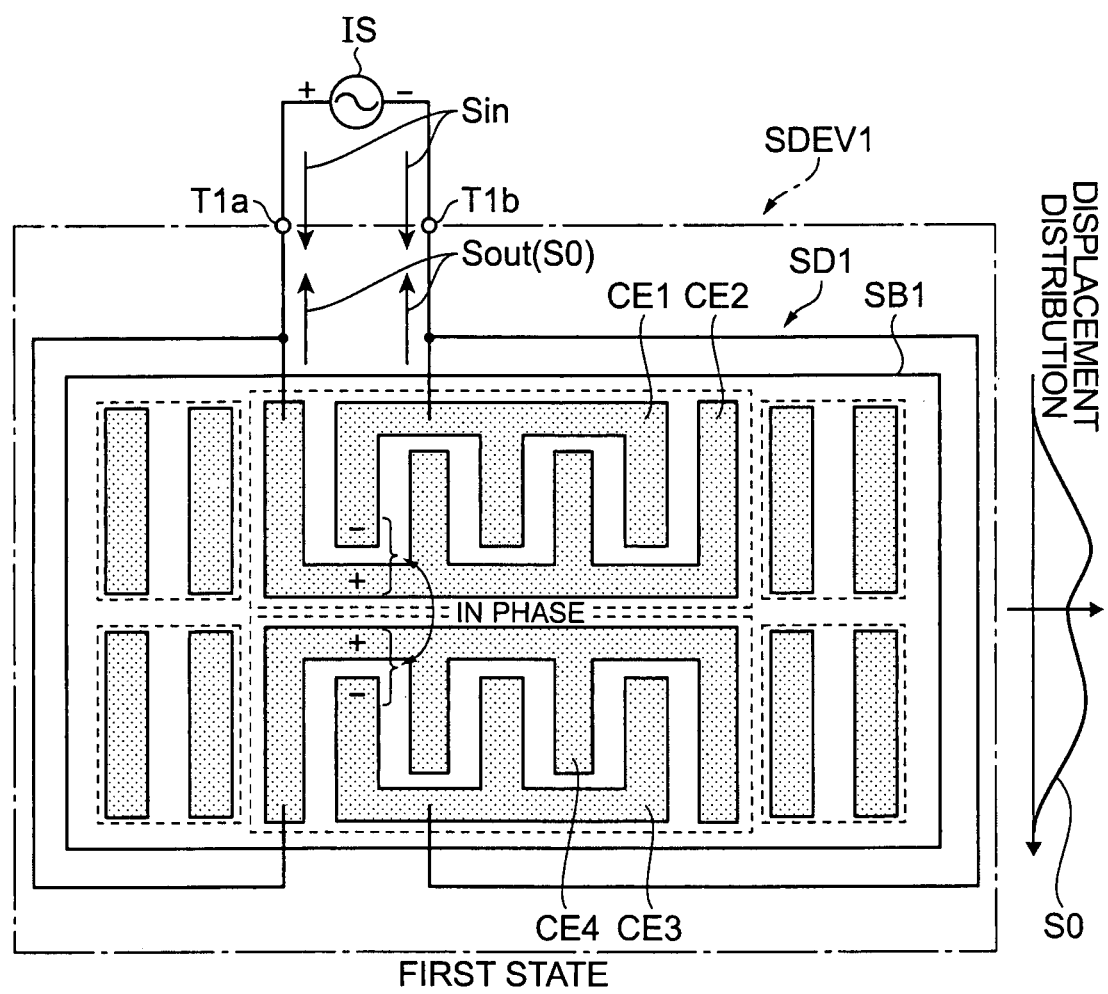
FIG. 2 is a diagram showing usage of a surface acoustic wave element according to the first embodiment.
Figure 3:
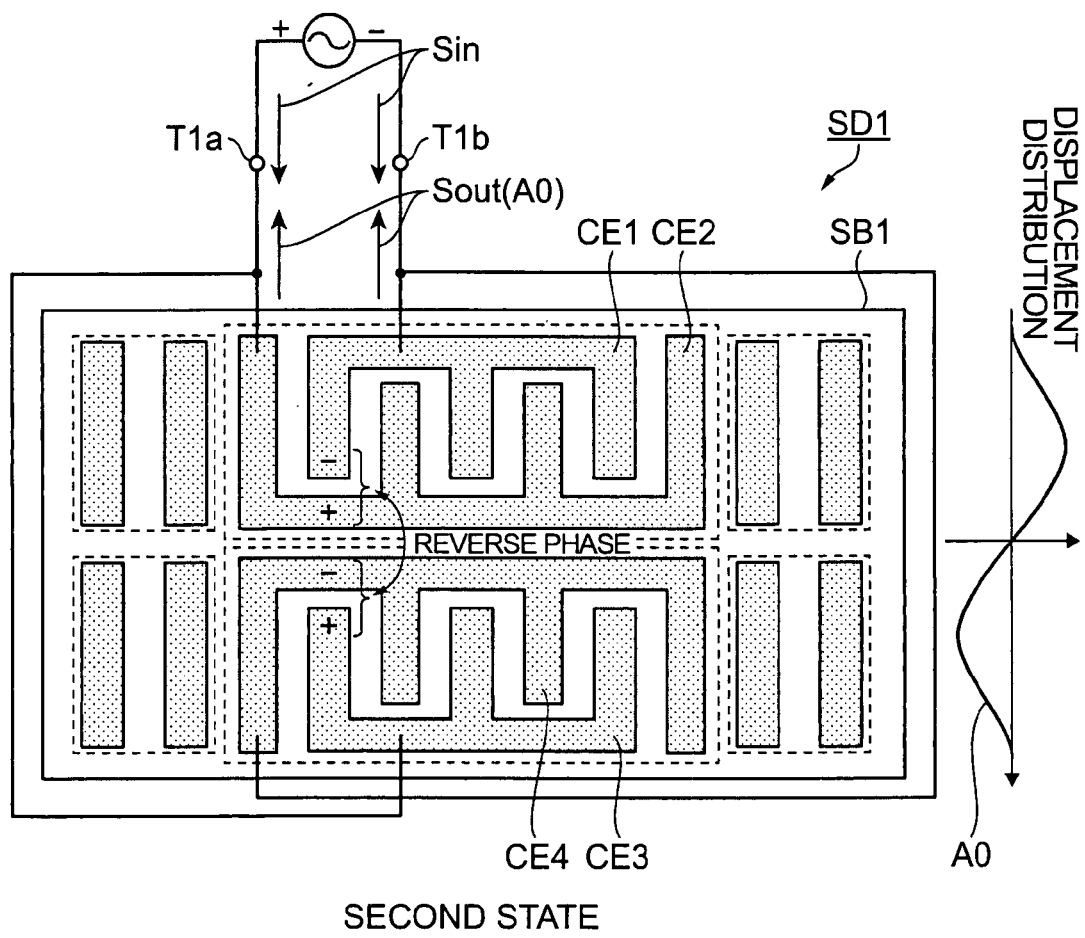
FIG. 3 is a diagram showing usage of a surface acoustic wave element according to the first embodiment.
Figure 4:
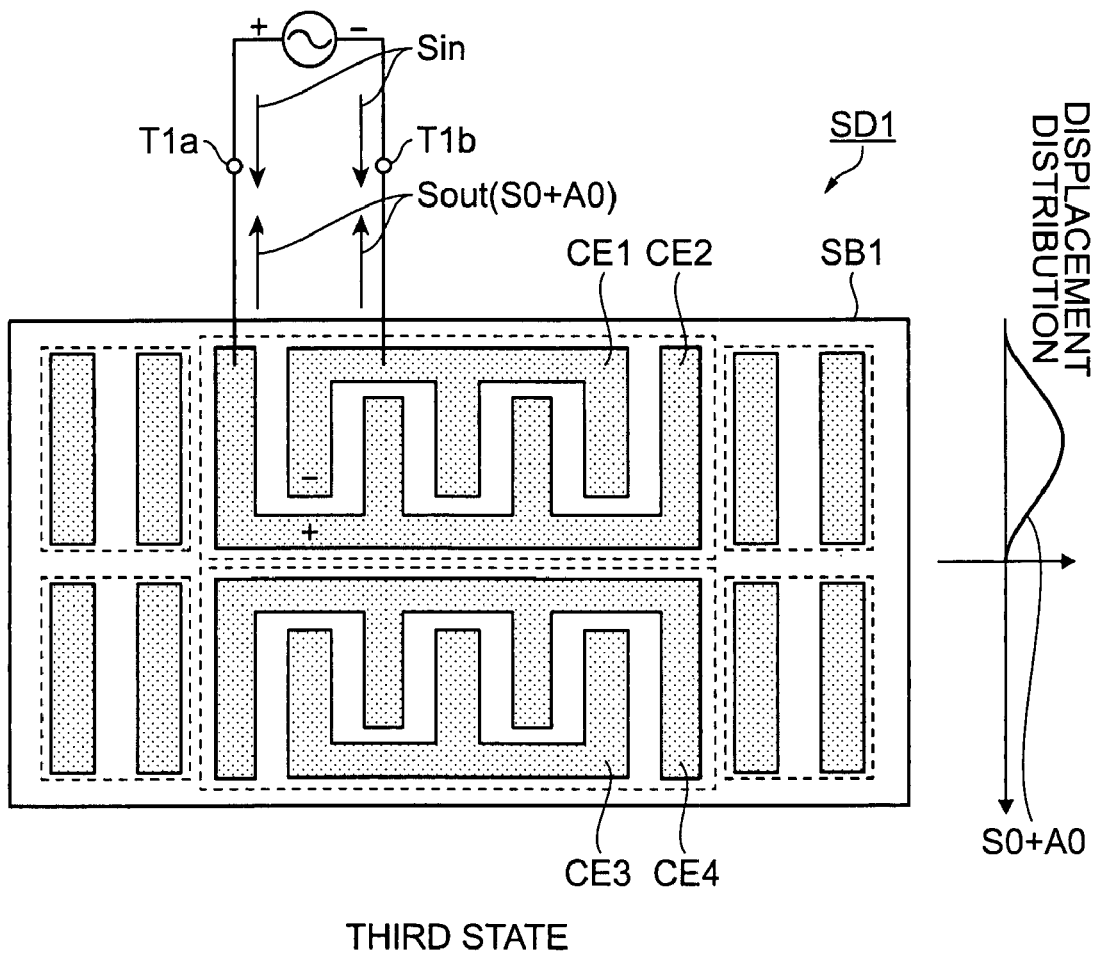
FIG. 4 is a diagram showing usage of a surface acoustic wave element according to the first embodiment.

FIGS. 2, 3, and 4 show usage of the surface acoustic wave element according to the first embodiment. The usage of the surface acoustic wave element SD1 in the first embodiment, more precisely, the usage of a surface acoustic wave device SDEV1 provided with the surface acoustic wave element SD1, and terminals T1a and T1b includes following three states.

First state: to generate a first resonance signal having a first frequency f1

Second state: to generate a second resonance signal having a second frequency f2 that is higher than the first frequency f1

Third state: to generate a third resonance signal having a third frequency f3 positioned between the first frequency f1 and the second frequency f2

[First State]

In the first state, as shown in FIG. 2, the terminals T1a and T1b apply an alternating input signal Sin supplied from an input signal source IS. The terminal T1a is electrically coupled to the second interdigital transducer CE2 and the fourth interdigital transducer CE4, while the terminal T1b is electrically coupled to the first interdigital transducer CE1 and the third interdigital transducer CE3.

When the alternating input signal Sin is applied from the terminals T1a and T1b to the surface acoustic wave element SD1, an alternating input signal that is in-phase with the alternating input signal supplied to the first interdigital transducer CE1 is applied to the third interdigital transducer CE3. Further, an alternating input signal that is in-phase with the alternating input signal supplied to the second interdigital transducer CE2 is applied to the fourth interdigital transducer CE4. More specifically, a phase of the alternating input signal applied to the electrode fingers of the first interdigital transducer CE1 is equal to a phase of the alternating input signal applied to the electrode fingers of the third interdigital transducer CE3. Further, a phase of the alternating input signal applied to the electrode fingers of the second interdigital transducer CE2 is equal to a phase of the alternating input signal applied to the electrode fingers of the fourth interdigital transducer CE4. For example, when a voltage value of the first interdigital transducer CE1 is −V1 while a voltage value of the second interdigital transducer CE2 is +V1, a voltage value of the third interdigital transducer CE3 is −V1 and a voltage value of the fourth interdigital transducer CE4 is +V1. Accordingly, the piezoelectric substrate SB1 resonates so that a displacement distribution is in a mode S0. As a result, a detector (not shown) coupled to the terminals T1a and T1b such as a current-voltage converter can take out a resonance signal Sout having the first frequency f1 corresponding to the mode S0 as an output signal.

[Second State]

In the second state shown in FIG. 3, unlike the first state, the terminal T1a is electrically coupled to the second interdigital transducer CE2 and the third interdigital transducer CE3, while the terminal T1b is electrically coupled to the first interdigital transducer CE1 and the fourth interdigital transducer CE4.

When the alternating input signal Sin is applied from the terminals T1a and T1b to the surface acoustic wave element SD1 similarly to the first state, but unlike the first state, an alternating input signal that is reverse phase to the alternating input signal supplied to the first interdigital transducer CE1 is applied to the third interdigital transducer CE3. Further, an alternating input signal that is reverse phase to the alternating input signal supplied to the second interdigital transducer CE2 is applied to the fourth interdigital transducer CE4. More specifically, there is a phase difference of 180 degrees between the alternating input signal applied to the electrode fingers of the first interdigital transducer CE1 and the alternating input signal applied to the electrode fingers of the third interdigital transducer CE3. Further, there is a phase difference of 180 degrees between the alternating input signal applied to the electrode fingers of the second interdigital transducer CE2 and the alternating input signal applied to the electrode fingers of the fourth interdigital transducer CE4. For example, when the voltage value of the first interdigital transducer CE1 is $-V1$ while the voltage value of the second interdigital transducer CE2 is $+V1$, the voltage value of the third interdigital transducer CE3 is $+V1$ and the voltage value of the fourth interdigital transducer CE4 is $-V1$. Accordingly, the piezoelectric substrate SB1 resonates so that the displacement distribution is in a mode A0. As a result, the detector coupled to the terminals T1a and T1b can take out a resonance signal Sout having the second frequency f2 that is higher than the first frequency and corresponding to the mode A0 as an output signal.

[Third State]

In the third state shown in FIG. 4, unlike the first and second states, the terminal T1a is electrically coupled to the second interdigital transducer CE2 and the terminal T1b is electrically coupled to the first interdigital transducer CE1, while the third interdigital transducer CE3 and the fourth interdigital transducer CE4 are open. More precisely, an input impedance between the third interdigital transducer CE3 and the fourth interdigital transducer CE4 is higher than an input impedance between the first interdigital transducer CE1 and the second interdigital transducer CE2.

When the alternating input signal Sin is applied from the terminals T1a and T1b to the surface acoustic wave element SD1 similarly to the first and second states, but unlike the first and second states, the piezoelectric substrate SB1 resonates so that the displacement distribution is in a mode (S0+A0). The mode (S0+A0) has a displacement distribution in which the displacement distribution in the mode S0 and the displacement distribution in the mode A0 are added together. As a result, the detector coupled to the terminals T1a and T1b can take out a resonance signal Sout (S0+A0) having the third frequency f3 positioned between the first frequency f1 and the second frequency f2 as an output signal.

In the usage of the surface acoustic wave element SD1 according to the first embodiment, as described with reference to FIG. 4, the displacement distribution of the piezoelectric substrate SB1 is in the mode (S0+A0) by applying the alternating input signal Sin to the first interdigital transducer CE1 and the second interdigital transducer CE2 under a condition in which the input impedance between the third interdigital transducer CE3 and the fourth interdigital transducer CE4 is higher than the input impedance between the first interdigital transducer CE1 and the second interdigital transducer CE2. Therefore, the resonance signal Sout (S0+A0) corresponding to the mode (S0+A0) and having the third frequency f3 that is different from the first frequency f1 and the second frequency f2 becomes obtainable. In the usage of the surface acoustic wave element SD1 described with reference to FIG. 4, a value of the input impedance between the third interdigital transducer CE3 and the fourth interdigital transducer CE4 is remarkably large as the third interdigital transducer CE3 and the fourth interdigital transducer CE4 are electrically open therebetween.

[First Modification]

When the first interdigital transducer unit CEU1 and the second interdigital transducer unit CEU2 are physically identical, that is, identical in size, shape, direction and the like, for example, and the value of the input impedance between the third interdigital transducer CE3 and the fourth interdigital transducer CE4 is remarkably large, the third frequency f3 is in the middle between the first frequency f1 and the second frequency f2, that is (f1+f2)/2. Therefore, the resonance signal Sout (S0+A0) having the third frequency f3 that is (f1+f2)/2 becomes obtainable. The input impedance between the third interdigital transducer CE3 and the fourth interdigital transducer CE4 is allowed to be remarkably large by making the third interdigital transducer CE3 and the fourth interdigital transducer CE4 electrically open as explained with reference to FIG. 4.

[Second Modification]

Figure 5:
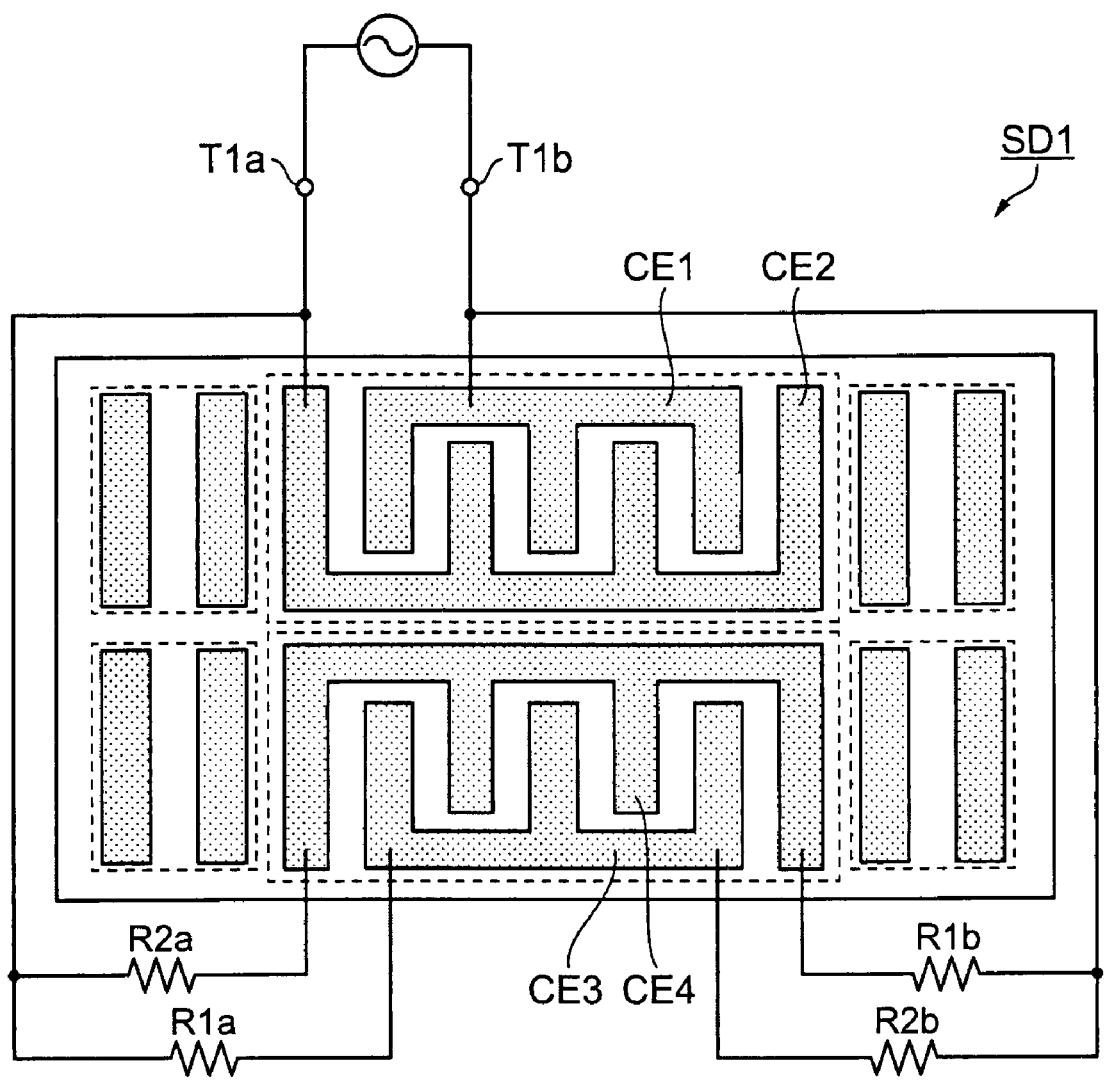
FIG. 5 is a diagram showing wiring of a surface acoustic wave element according to a second modification of the first embodiment.

Wiring for the first interdigital transducer CE1 through the fourth interdigital transducer CE4 in the first embodiment as above equals to changing resistance values of resistors R1a, R1b, R2a, and R2b in a configuration shown in FIG. 5. More specifically, (a) the terminal T1a is coupled to the second interdigital transducer CE2, (b) the resistor R1a is arranged between the second interdigital transducer CE2 and the third interdigital transducer CE3 while the resistor R2a is arranged between the second interdigital transducer CE2 and the fourth interdigital transducer CE4. Further, (c) the terminal T1b is coupled to the first interdigital transducer CE1 and the resistor R2b is arranged between the first interdigital transducer CE1 and the third interdigital transducer CE3 while the resistor R1b is arranged between the first interdigital transducer CE1 and the fourth interdigital transducer CE4.

Figure 6:
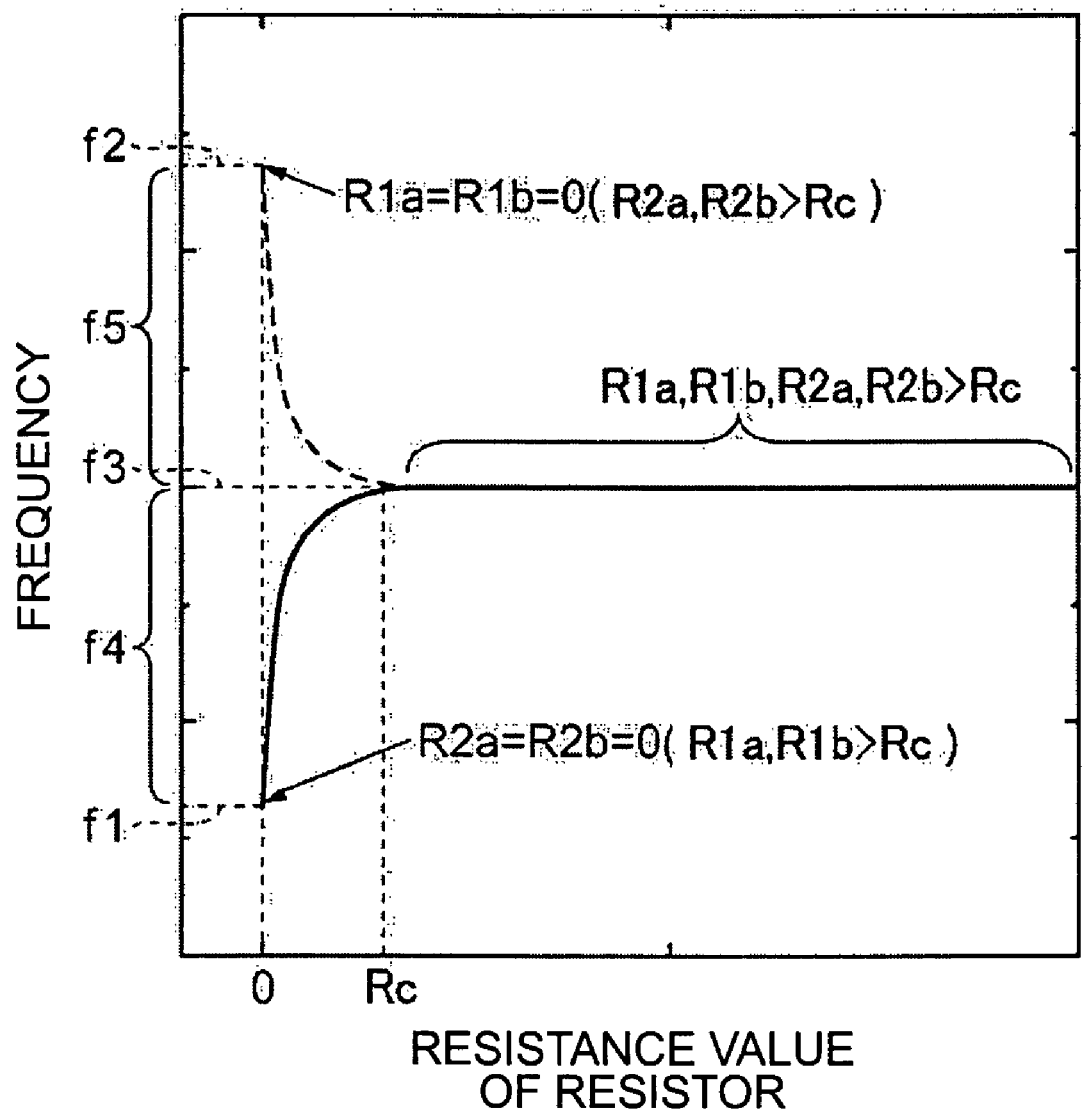
FIG. 6 is a diagram showing a relation between a resistance value and a frequency in usage of the second modification of the first embodiment.

According to the configuration as above, (A1) the resistance values of the resistors R2a and R2b are made to be 0 (zero) while the resistance values of the resistors R1a and R1b are made to be larger than a critical resistance value Rc, making the wiring equal to that of the first state described above. Consequently, as shown in FIG. 6, the resonance signal Sout having the first frequency f1 is generated. The critical resistance value Rc is the resistance values of the R1a and R1b when the resistance values of the R1a and R1b are increased from 0 (zero) and a resonance frequency of the surface acoustic wave element SD1 is convergent at a constant value. The Rc is about 500 Ω, for example.

Further, (A2) the resistance values of the resistors R1a and R1b are made to be 0 (zero) while the resistance values of the resistors R2a and R2b are made to be larger than a critical resistance value Rc, making the wiring equal to that of the second state described above. Consequently, as shown in FIG. 6, the resonance signal Sout having the second frequency f2 is generated. The critical resistance value Rc is the resistance values of the R2a and R2b when the resistance value of the R2a and R2b are increased from 0 (zero) and the resonance frequency of the surface acoustic wave element SD1 is convergent at a constant value. The Rc is about 500 Ω, for example.

Furthermore, (A3) the four resistance values for the resistors R1a, R1b, R2a, and R2b are made to be larger than a critical resistance value Rc, making the wiring equal to that of the third state described above. Consequently, as shown in FIG. 6, the resonance signal Sout having the third frequency f3 is generated. The critical resistance value Rc is resistance values of the R1a, R1b, R2a, and R2b when the resistance values of the R1a, R1b, R2a, and R2b are increased from 0 (zero) and the resonance frequency of the surface acoustic wave element SD1 is convergent at a constant value. The Rc is about 500 Ω, for example.

Figure 7:
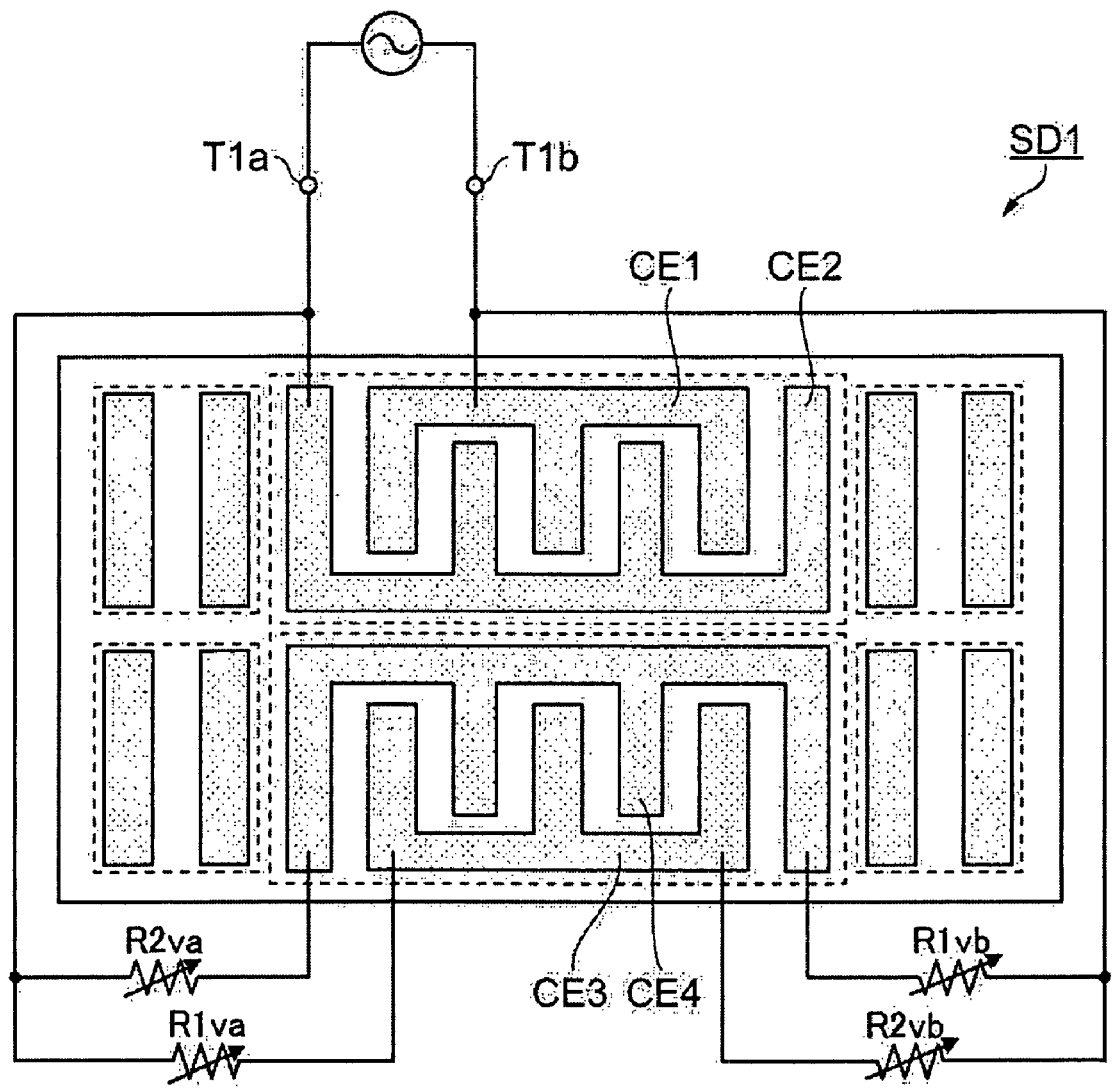
FIG. 7 is a diagram showing a specific example according to the second modification of the first embodiment.

In order to change the resistance values of the resistors R1a, R1b, R2a, and R2b, the surface acoustic wave device SDEV1 can be configured by using variable resistors R1va, R1vb, R2va, and R2vb as shown in FIG. 7.

Further, the configurations A1 through A3 above can be realized because each of the resistors R1a, R1b, R2a, and R2b is shunted when the resistance value is 0 (zero), and a resistance element for each of the resistors R1a, R1b, R2a, and R2b is formed when the resistance value is larger than the critical resistance value Rc.

[Third Modification]

Unlike the second modification described above, more specifically, compared to (A1) described above, (B1) while the resistance values of the resistors R2a and R2b are made to be 0 (zero), the resistance values of the resistors R1a and R1b are not made to be larger than the critical resistance value Rc, but changed within a range of the value from 0 (zero) to the critical resistance value Rc. Consequently, as shown in FIG. 6, a resonance signal having a frequency f4 in a range from the first frequency f1 to the third frequency f3 is generated.

Further, compared to (A2) described above, (B2) while the resistance values of the resistors R1a and R1b are made to be 0 (zero), the resistance value of the resistors R2a and R2b are not made to be larger than the critical resistance value Rc, but changed within a range of the value from 0 (zero) to the critical resistance value Rc. Consequently, as shown in FIG. 6, a resonance signal having a frequency f5 in a range from the second frequency f2 to the third frequency f3 is generated.

Figure 8:
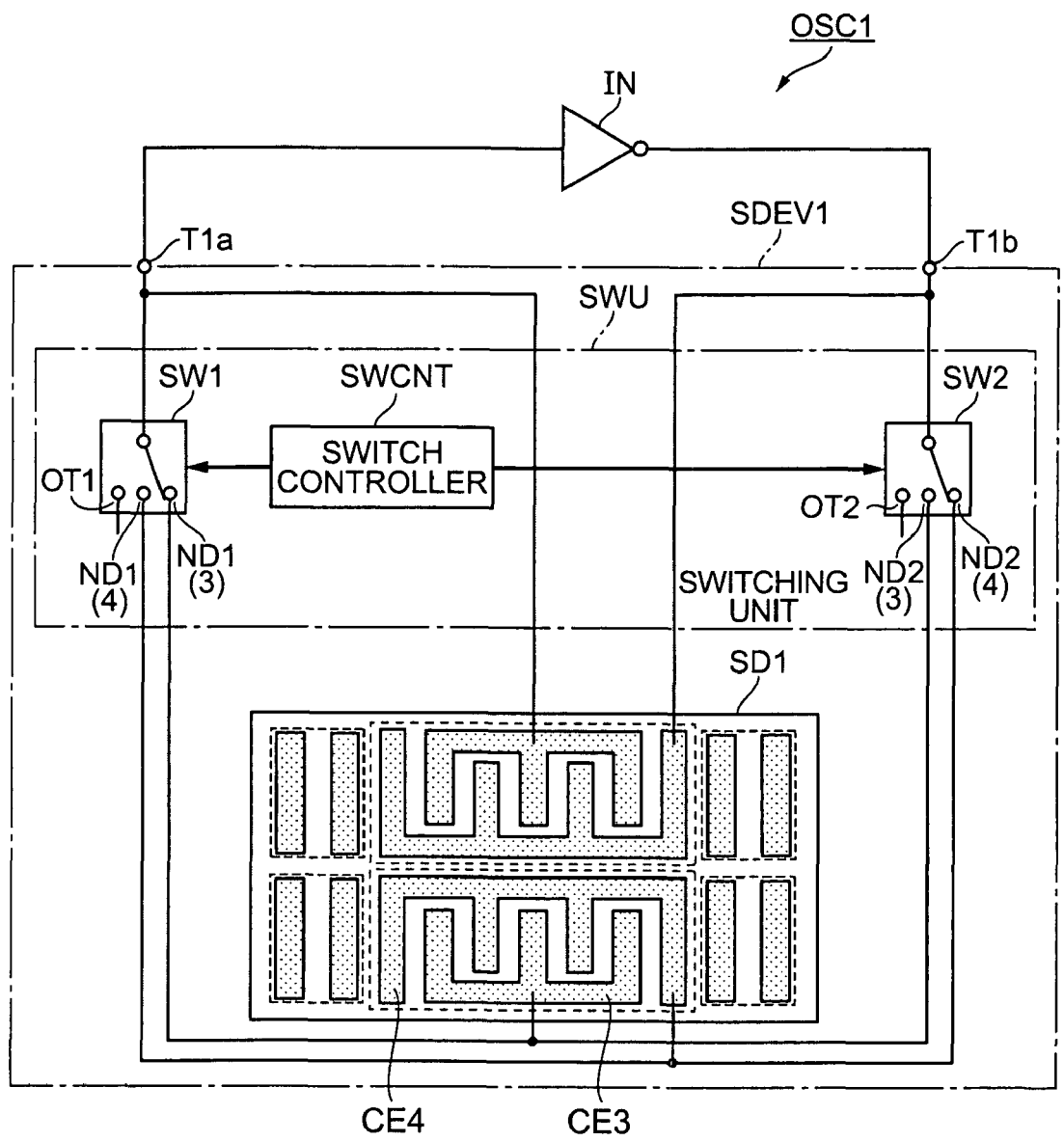
FIG. 8 is a diagram showing a configuration of an oscillator according to the first embodiment.
Figure 9:
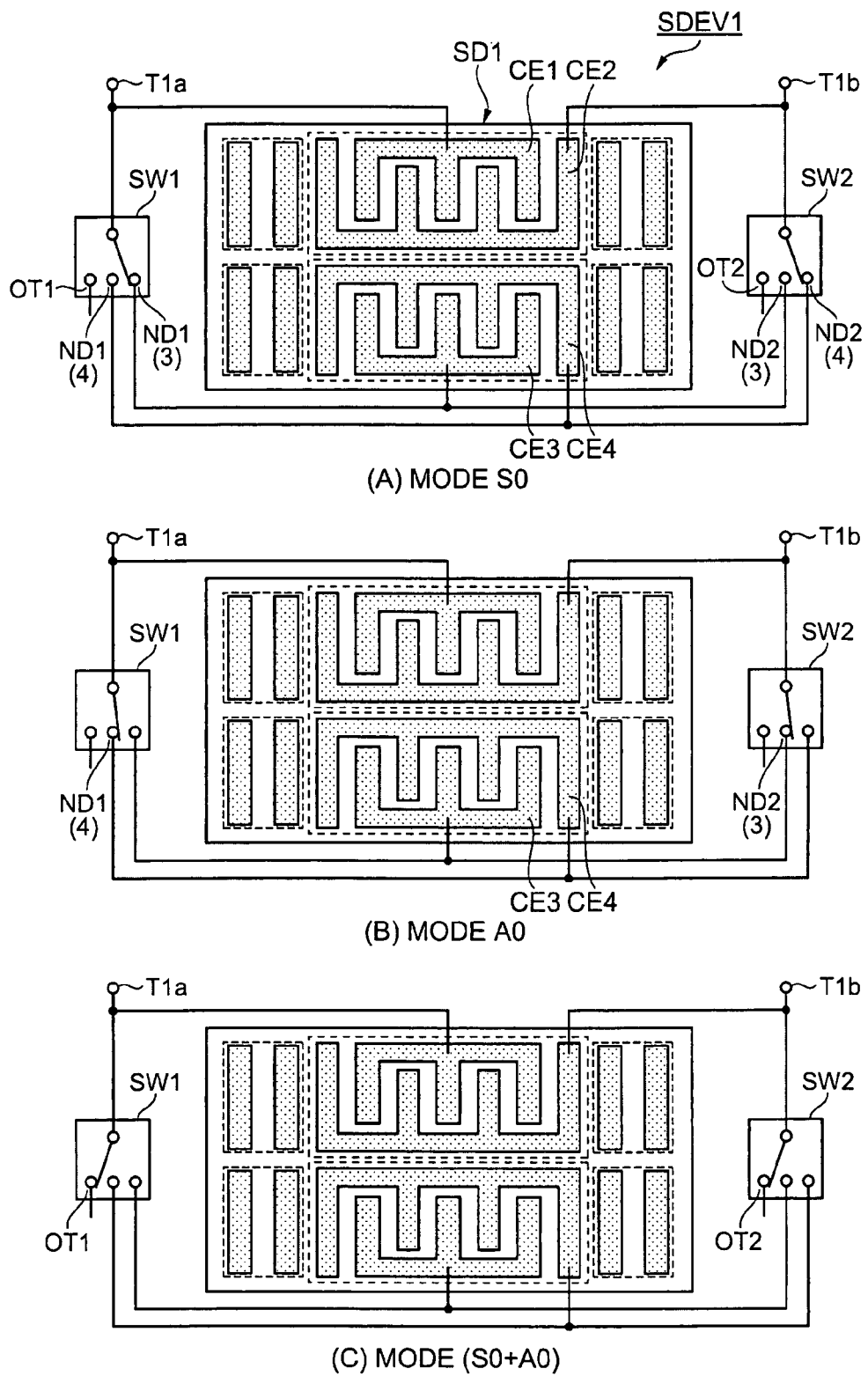
FIGS. 9A through 9C are diagrams showing operations of the surface acoustic wave device according to the first embodiment.

FIG. 8 shows a configuration of an oscillator including a surface acoustic wave device provided with the surface acoustic wave element in the first embodiment. FIG. 9 shows an operation of the surface acoustic wave device in the first embodiment.

The wiring for the first interdigital transducer CE1 through the fourth interdigital transducer CE4 in the first embodiment described above are provided by using the surface acoustic wave device SDEV1 in which a switch controller SWCNT can switch a connection state of a first switch SW1 and a second switch SW2 of a switching unit SWU in the configuration shown in FIG. 8.

The first switch SW1 is a switch electrically coupling the terminal T1a to one of a node ND1(3) coupled to the third interdigital transducer CE3, a node ND1(4) coupled to the fourth interdigital transducer CE4, and an open end OT1.

The second switch SW2 is a switch electrically coupling the terminal T1b to one of a node ND2(4) coupled to the fourth interdigital transducer CE4, a node ND2(3) coupled to the third interdigital transducer CE3, and an open end OT2.

In addition, the switch controller SWCNT is a controller synchronously switching the connection state of the first switch SW1 and the connection state of the second switch SW2. The switch controller SWCNT includes following three connection states.

A first connection state shown in FIG. 9A is a state (mode S0) in which the first switch SW1 electrically couples the first terminal T1a and the node ND1(3) coupled to the third interdigital transducer CE3, while the second switch SW2 electrically couples the second terminal T1b and the node ND2(4) coupled to the fourth interdigital transducer CE4. At this time, relations between R2a and R2b, and R1a and R1b are R2a=R2b=0 and R1a=R1b=∞. Further, as shown in FIG. 6, the resonance frequency of the surface acoustic wave element is f1.

A second connection state shown in FIG. 9B is a state (mode A0) in which the first switch SW1 electrically couples the first terminal T1a and the node ND1(4) coupled to the fourth interdigital transducer CE4 while the second switch SW2 electrically couples the second terminal T1b and the node ND2(3) coupled to the third interdigital transducer CE3. At this time, relations between R1a and R1b, and R2a and R2b are R1a=R1b=0 and R2a=R2b=∞. Further, as shown in FIG. 6, the resonance frequency of the surface acoustic wave element is f2.

A third connection state shown in FIG. 9C is a state (mode (S0+A0)) in which the first switch SW1 couples the first terminal T1a and the open end OT1 while the second switch SW2 couples the second terminal T1b and the open end OT2. At this time, relations among R1a, R1b, R2a, and R2b are R1a=R1b=R2a=R2b=∞. Further, as shown in FIG. 6, the resonance frequency of the surface acoustic wave element is f3.

The switch controller SWCNT can switch the connection states of the first switch SW1 and the second switch SW2 to one of the first to third connection states, thereby allowing the resonance frequency of the surface acoustic wave element SD1 to be switched to f1, f2, or f3. Accordingly, by using a single surface acoustic wave element having two of the interdigital transducer units CEU1 and CEU2 on a piezoelectric substrate, a surface acoustic wave device that resonates at one of the three resonance frequencies f1, f2, and f3 is obtained.

In addition, the terminals T1a and T1b of the surface acoustic wave device SDEV1 in FIG. 8 are coupled to an inverter IN as an amplifier, providing an oscillator OSC1 that can output oscillation signals with three frequencies by using the single surface acoustic wave element SD1.

Second Embodiment

Figure 10:
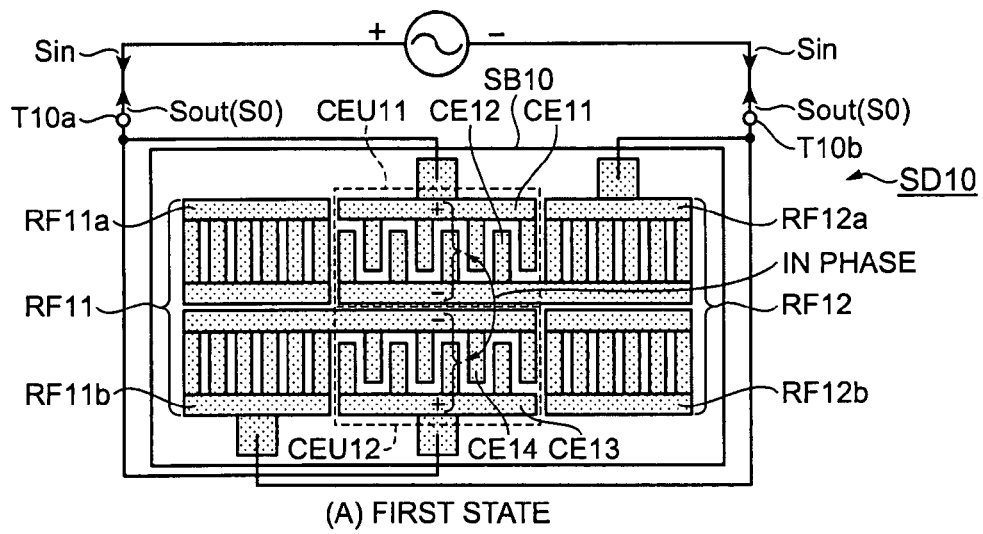
FIGS. 10A through 10C are diagrams showing configurations of a surface acoustic wave element and usage thereof according to a second embodiment.
Figure 10:
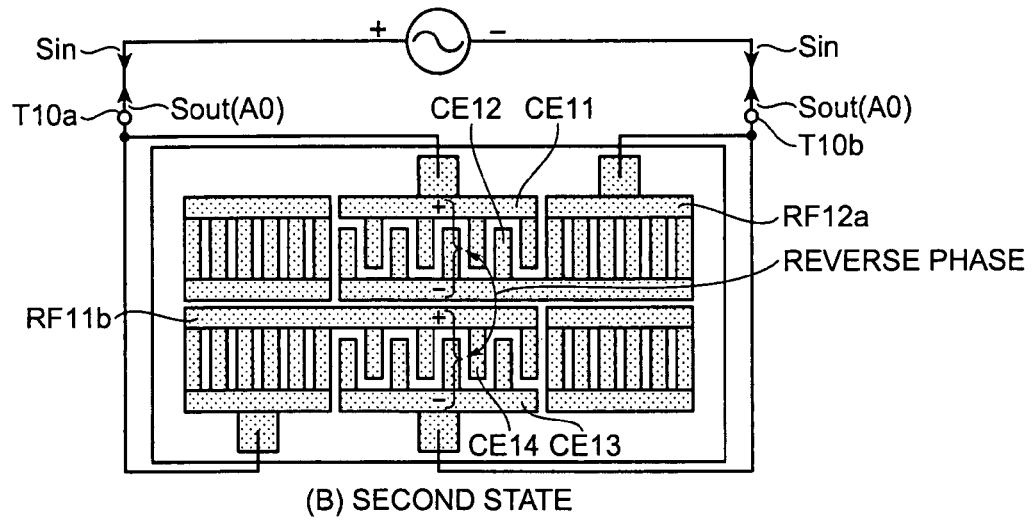
Figure 10:
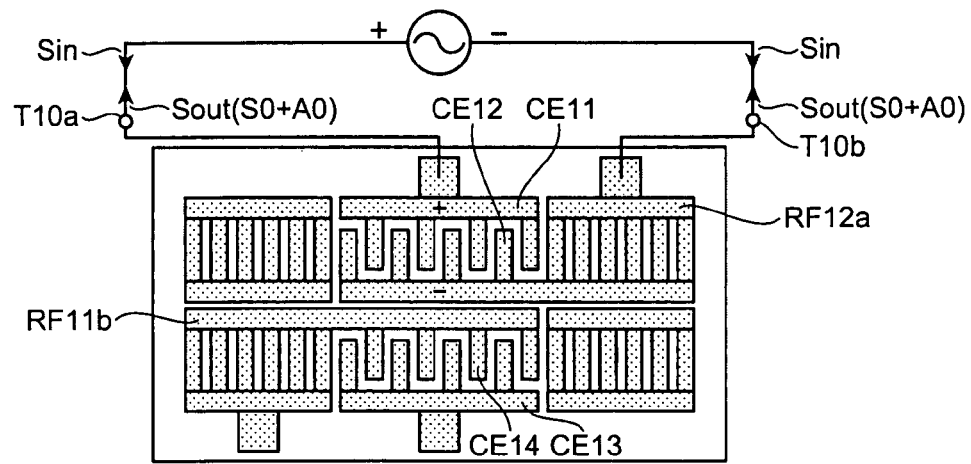

FIGS. 10A through 10C show configurations of a surface acoustic wave element and usage thereof according to a second embodiment. A surface acoustic wave element SD10 according to the second embodiment includes, similarly to the surface acoustic wave element SD1 in the first embodiment, a piezoelectric substrate SB10, a first interdigital transducer unit CEU11 and a second interdigital transducer unit CEU12, and a first reflector RF11 and a second reflector RF12.

Similarly to the first interdigital transducer unit CEU1 and the second interdigital transducer unit CEU2 in the first embodiment, the first interdigital transducer unit CEU11 and a second interdigital transducer unit CEU12 in the second embodiment are also positioned adjacent to each other so as to be perpendicular to a propagation direction of a surface acoustic wave. Further, the first interdigital transducer unit CEU11 and the second interdigital transducer unit CEU12 are positioned close enough to each other so that the surface acoustic wave element SD10 can excite a laterally coupled surface acoustic wave. Furthermore, the first interdigital transducer unit CEU11 includes a first interdigital transducer CE11 and a second interdigital transducer CE12 while the second interdigital transducer unit CEU12 similarly includes a third interdigital transducer CE13 and a fourth interdigital transducer CE14.

On the other hand, unlike the reflectors RF1 and RF2 in the first embodiment, the reflector RF11 includes sub-reflectors RF11a and RF11b, while the reflector RF12 includes sub-reflectors RF12a and RF12b.

In the reflector RF11, the sub-reflector RF11b is coupled to the fourth interdigital transducer CE14. By applying a voltage to the sub-reflector RF11b, a potential of the fourth interdigital transducer CE14 is equal to the voltage applied to the sub-reflector RF11b.

Similarly, in the reflector RF12, the sub-reflector RF12b is coupled to the second interdigital transducer CE12. Therefore, by applying a voltage to the sub-reflector RF12a, a potential of the second interdigital transducer CE12 is equal to the voltage applied to the sub-reflector RF12a.

Usage of the surface acoustic wave element SD10 in the second embodiment includes, similarly to the usage of the surface acoustic wave element SD1 in the first embodiment, a first state, a second state, and a third state. Effects obtained by the states in the second embodiment are same as those of the states in the first embodiment respectively corresponding to them. Now, the states in the second embodiment will be described by focusing on differences from the states in the first embodiment.

[First State]

A terminal T10a is coupled to the first interdigital transducer CE11 and the third interdigital transducer CE13 while a terminal T10b is coupled to the sub-reflectors RF11b and RF12a.

As shown in FIG. 10A, by applying an alternating input signal Sin from the terminals T10a and T10b, for example, the input signal Sin with a positive voltage is directly applied to the first interdigital transducer CE11 and the third interdigital transducer CE13. Further, an input signal Sin with a negative voltage is applied to the second interdigital transducer CE12 through the sub-reflector RF12a, and to the fourth interdigital transducer CE14 through the sub-reflector RF11b. As a result, similarly to the first state in the first embodiment, a voltage relation between the first interdigital transducer CE11 and the second interdigital transducer CE12 is in-phase with a voltage relation between the third interdigital transducer CE13 and the fourth interdigital transducer CE14. Therefore, similarly to the first state in the first embodiment, a resonance signal Sout (S0) having the first frequency f1 is obtained.

[Second State]

The terminal T10a is coupled to the first interdigital transducer CE11 and the sub-reflector RF11b, while the terminal T10b is coupled to the third interdigital transducer CE13 and the sub-reflector RF12a.

As shown in FIG. 10B, by applying the alternating input signal Sin from the terminals T10a and T10b, for example, the input signal Sin with a positive voltage is directly applied to the first interdigital transducer CE11 and applied to the fourth interdigital transducer CE14 through the sub-reflector RF11b. Further, the input signal Sin with a negative voltage is directly applied to the third interdigital transducer CE13 and applied to the second interdigital transducer CE12 through the sub-reflector RF12a. As a result, similarly to the second state in the first embodiment, the voltage relation between the first interdigital transducer CE11 and the second interdigital transducer CE12 is reversed phase with the voltage relation between the third interdigital transducer CE13 and the fourth interdigital transducer CE14. Therefore, similarly to the second state in the first embodiment, a resonance signal Sout (A0) having the second frequency f2 is obtained.

[Third State]

The terminal T10a is coupled to the first interdigital transducer CE11, while the terminal T10b is coupled to the sub-reflector RF12a. The third interdigital transducer CE13 and the sub-reflector RF11b are left open.

As shown in FIG. 10C, by applying the alternating input signal Sin from the terminals T10a and T10b, for example, the input signal Sin with a positive voltage is directly applied to the first interdigital transducer CE11 while the input signal Sin with a negative voltage is applied to the second interdigital transducer CE12 through the sub-reflector RF12a. On the other hand, the input signal Sin is not applied to the third interdigital transducer CE13 and the fourth interdigital transducer CE14. As a result, similarly to the third state in the first embodiment, a resonance signal Sout (S0+A0) having the third frequency f3 is obtained.

As described above, in the usage of the surface acoustic wave element SD10 in the second embodiment, similarly to the usage of the surface acoustic wave element SD1 in the first embodiment, the resonance signal Sout (S0+A0) having the third frequency f3 is obtained.

[First Modification]

Similarly to the first modification of the first embodiment, when the first interdigital transducer unit CEU11 and the second interdigital transducer unit CEU12 are physically identical, the third frequency f3 is in the middle between the first frequency f1 and the second frequency f2, that is (f1+f2)/2. Therefore, the resonance signal (S0+A0) having the third frequency f3 that is (f1+f2)/2 becomes obtainable.

[Second Modification]

Figure 11:
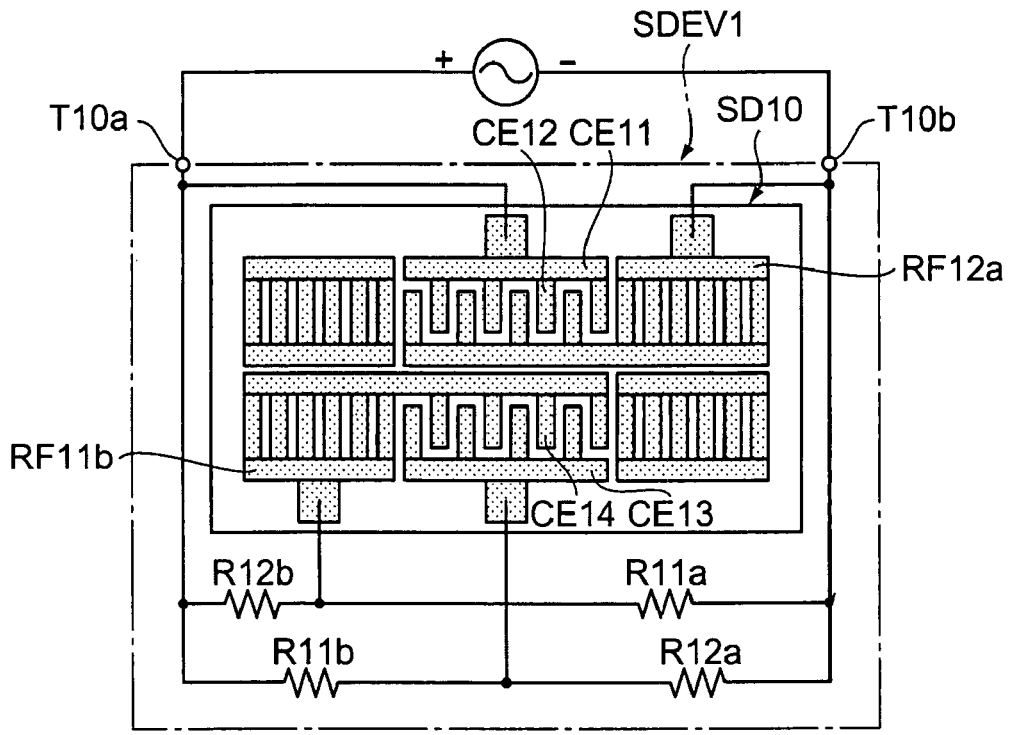
FIG. 11 is a diagram showing wiring of a surface acoustic wave element according to a second modification of the second embodiment.

FIG. 11 shows wiring of a surface acoustic wave element according to a second modification of the second embodiment. Wiring for the first interdigital transducer CE11 through the fourth interdigital transducer CE14 in the second embodiment as above equals to changing resistance values of resistors R11a, R11b, R12a, and R12b in a configuration shown in FIG. 11. More specifically, (a) the terminal T10a is coupled to the first interdigital transducer CE11, (b) the resistor R12b is arranged between the terminal T10a and the sub-reflector RF11b, while the resistor R11b is arranged between the terminal T10a and the third interdigital transducer CE13. Further, (c) the terminal T10b is coupled to the sub-reflector RF12a, and (d) the resistor R11a is arranged between the terminal T10b and the sub-reflector RF11b, while the resistor R12a is arranged between the terminal T10b and the third interdigital transducer CE13.

According to the configuration as above, (A1) resistance values of the resistors R11a and R11b are made to be 0 (zero) while resistance values of the resistors R12a and R12b are made to be larger than a critical resistance value Rc or to be substantially "∞", making the wiring equal to that of the first state described above. Consequently, the resonance signal Sout (S0) having the first frequency f1 is generated.

Further, (A2) the resistance values of the resistors R12a and R12b are made to be 0 (zero) while the resistance values of the resistors R11a and R11b are made to be larger than the critical resistance value Rc or to be substantially "∞", making the wiring equal to that of the second state described above. Consequently, the resonance signal Sout (A0) having the second frequency f2 is generated.

Furthermore, (A3) the four resistance values for the resistors R11a, R11b, R12a, and R12b are made to be larger than a critical resistance value Rc or to be substantially "∞", making the wiring equal to that of the third state described above.

Consequently, the resonance signal Sout (S0+A0) having the third frequency f3 is generated.

[Third Modification]

Unlike the second modification described above, more specifically, compared to (A1) described above, (B1) while the resistance values of the resistors R2a and R2b are made to be 0 (zero), the resistance values of the resistors R1a and R1b are not made to be larger than the critical resistance value Rc, but changed within a range of the value from 0 (zero) to the critical resistance value Rc. Consequently, a resonance signal having a fourth frequency f4 (illustrated in FIG. 6) in a range from the first frequency f1 to the third frequency f3 is generated.

Further, compared to (A2) described above, (B2) while the resistance values of the resistors R12a and R12b are made to be 0 (zero), the resistance values of the resistors R11a and R11b are not made to be larger than the critical resistance value Rc, but changed within a range of the value from 0 (zero) to the critical resistance value Rc. Consequently, a resonance signal having a fifth frequency f5 (illustrated in FIG. 6) in a range from the second frequency f2 to the third frequency f3 is generated.

Similarly to the surface acoustic wave device SDEV1 provided with the surface acoustic wave element SD1 in the first embodiment (illustrated in FIGS. 8 and 9) and the oscillator OSCI (illustrated in FIG. 8), the surface acoustic wave element SD10 in the second embodiment, the first switch SW1, the second switch SW2, the terminals T10a and T10b are formed, configuring the surface acoustic wave device in the second embodiment (not shown). In addition, the surface acoustic wave device in the second embodiment (more specifically, the surface acoustic wave device in the second embodiment, which includes the switch unit SWU instead of the switch SW1 and the switch SW2) and the inverter IN, configuring an oscillator in the second embodiment (not shown).

Third Embodiment

Figure 12:
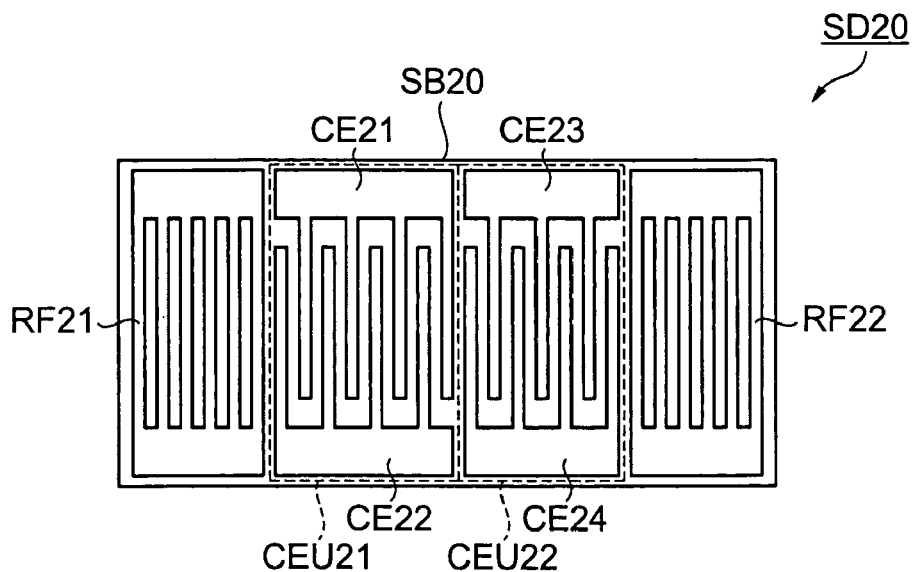
FIG. 12 is a diagram showing a configuration of a surface acoustic wave element according to a third embodiment.

FIG. 12 shows a configuration of a surface acoustic wave element according to a third embodiment. A surface acoustic wave element SD20 according to the third embodiment includes, similarly to the surface acoustic wave elements SD1 and SD10 in the first and second embodiments, a piezoelectric substrate SB20, a first interdigital transducer unit CEU21 and a second interdigital transducer unit CEU22, and a first reflector RF21 and a second reflector RF22.

Further, similarly to the first interdigital transducer units CEU1 and CEU11 and the second interdigital transducer units CEU2 and CEU12 in the first and second embodiments, the first interdigital transducer unit CEU21 in the third embodiment also includes a first interdigital transducer CE21 and a second interdigital transducer CE22 while the second interdigital transducer unit CEU22 similarly includes a third interdigital transducer CE23 and a fourth interdigital transducer CE24.

On the other hand, unlike the configuration laterally coupling the first interdigital transducer units CEU1 and CEU11 and the second interdigital transducer units CEU2 and CEU12 in the first and the second embodiments, in the third embodiment, the first interdigital transducer unit CEU21 and the second interdigital transducer unit CEU22 are configured as a so-called cascade connected surface acoustic wave element. Specifically, the first interdigital transducer unit CEU21 and the second interdigital transducer unit CEU22 are positioned adjacent to each other along a propagation direction of a surface acoustic wave so as to be close enough to each other to excite a cascade connected surface acoustic wave.

Usage of the surface acoustic wave element SD20 in the third embodiment includes, similarly to the usage of the surface acoustic wave element SD1 in the first embodiment, a first state, a second state, and a third state. Effects obtained by the states in the third embodiment are same as those of the states in the first embodiment respectively corresponding to them. Now, the states for using the surface acoustic wave element SD20 in the third embodiment will be described by focusing on differences from the states for using the surface acoustic wave element SD1 in the first embodiment.

[First state]

Figure 13:
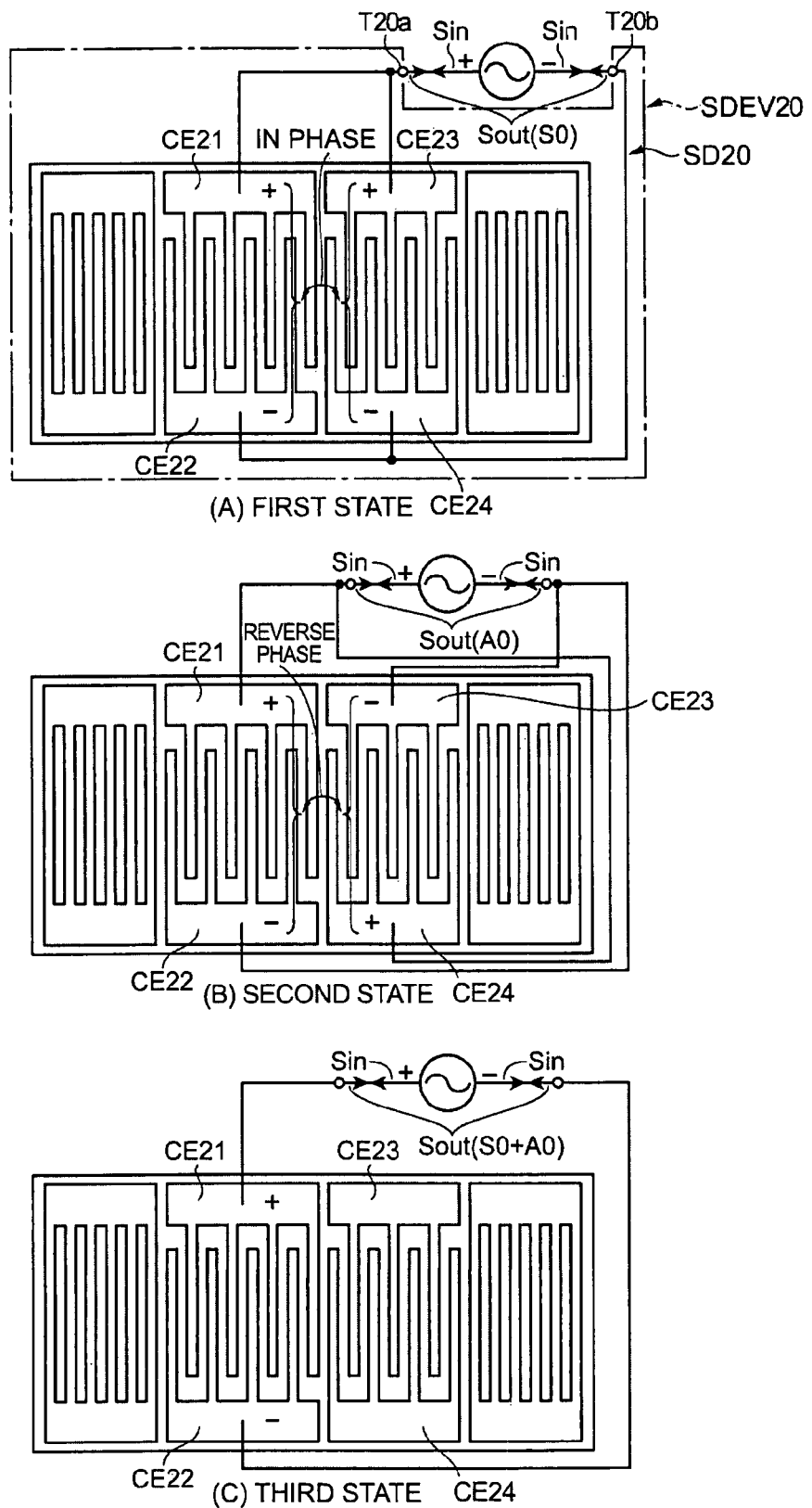
FIGS. 13A through 13C are diagrams showing usage of the surface acoustic wave element according to the third embodiment.

As shown in FIG. 13A, by applying an alternating input signal Sin to the surface acoustic wave element SD20, that is, for example, by applying the input signal Sin with a positive voltage to the first interdigital transducer CE21 and the third interdigital transducer CE23, and the input signal Sin with a negative voltage to the second interdigital transducer CE22 and the fourth interdigital transducer CE24, similarly to the first state in the first embodiment, a voltage relation between the first interdigital transducer CE21 and the second interdigital transducer CE22 is in-phase with a voltage relation between the third interdigital transducer CE23 and the fourth interdigital transducer CE24. Therefore, similarly to the first state in the first embodiment, the resonance signal Sout (S0) having the first frequency f1 is obtained.

[Second State]

As shown in FIG. 13B, by applying the input signal Sin to the surface acoustic wave element SD20, that is, for example, by applying the input signal Sin with a positive voltage to the first interdigital transducer CE21 and the fourth interdigital transducer CE24, and the input signal Sin with a negative voltage to the second interdigital transducer CE22 and the third interdigital transducer CE23, similarly to the second state in the first embodiment, the voltage relation between the first interdigital transducer CE21 and the second interdigital transducer CE22 is reversed phase with the voltage relation between the third interdigital transducer CE23 and the fourth interdigital transducer CE24. Therefore, similarly to the second state in the first embodiment, the resonance signal Sout (A0) having the second frequency f2 is obtained.

[Third state]

As shown in FIG. 13C, by applying the input signal Sin to the surface acoustic wave element SD20, that is, for example, by applying the input signal Sin with a positive voltage to the first interdigital transducer CE21, and the input signal Sin with a negative voltage to the second interdigital transducer CE22, but not applying the input signal Sin to the third interdigital transducer CE23 and the fourth interdigital transducer CE24, similarly to the third state in the first embodiment, the resonance signal Sout (S0+A0) having the third frequency f3 is obtained.

[First Modification]

Similarly to the first modification of the first embodiment, when the first interdigital transducer unit CEU21 and the second interdigital transducer unit CEU22 are physically identical, the third frequency f3 is in the middle between the first frequency f1 and the second frequency f2, that is, (f1+f2)/2. Therefore, the resonance signal (S0+A0) having the third frequency f3 that is (f1+f2)/2 becomes obtainable.

[Second Modification]

Figure 14:
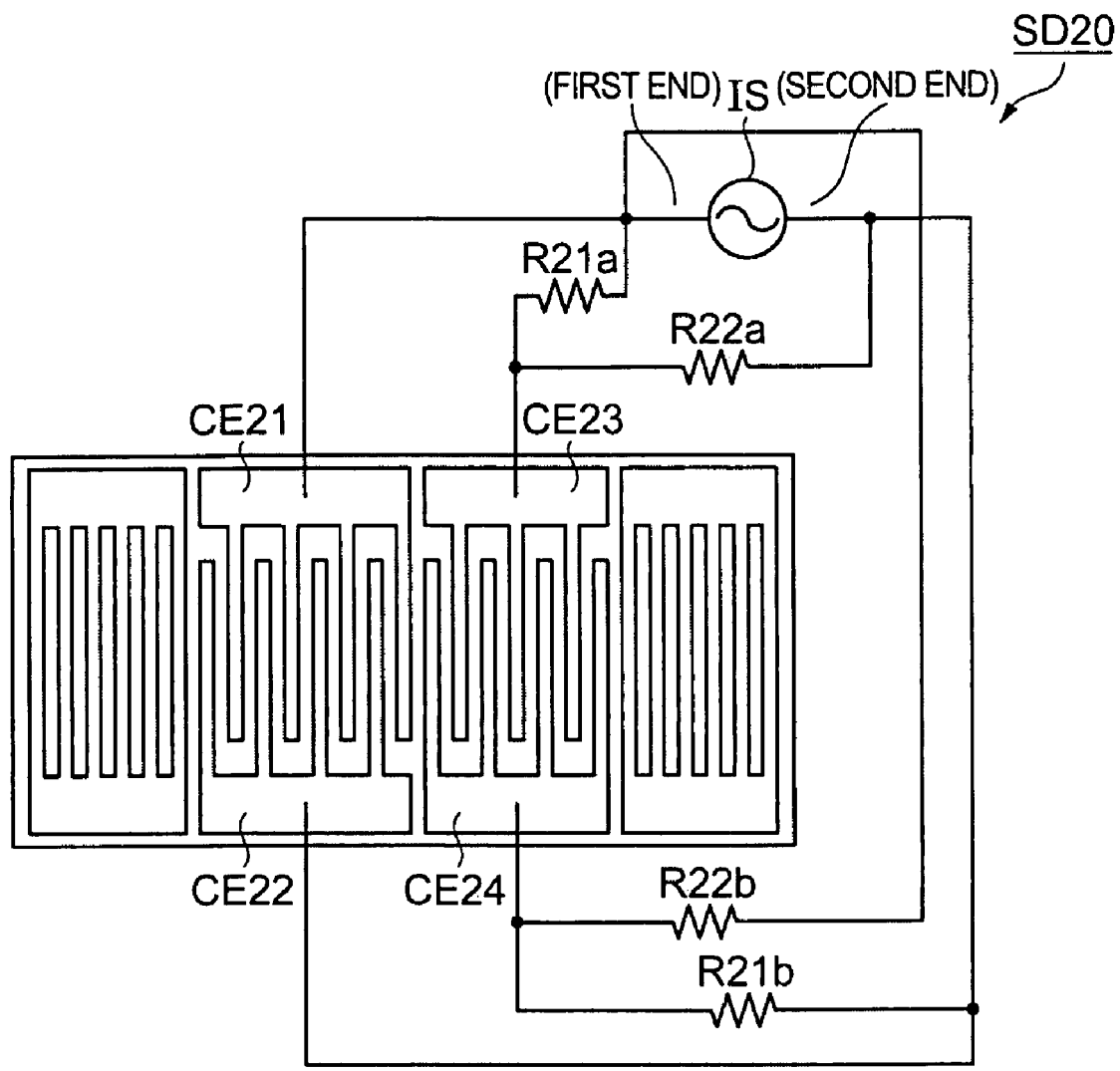
FIG. 14 is a diagram showing wiring of a surface acoustic wave element according to a second modification of the third embodiment.

FIG. 14 shows wiring of a surface acoustic wave element according to a second modification of the third embodiment. Wiring for the first interdigital transducer CE21 through the fourth interdigital transducer CE24 in the third embodiment as above equals to changing resistance values of resistors R21a, R21b, R22a, and R22b in a configuration shown in FIG. 14. More specifically, (a) one end (first end) of the input signal source IS is coupled to the first interdigital transducer CE21, (b) the resistor R21a is arranged between the one end (first end) of the input signal source IS and the third interdigital transducer CE23 while the resistor R22b is arranged between the one end (first end) of the input signal and the fourth interdigital transducer CE24. Further, (c) the other end (second end) of the input signal source IS is coupled to the second interdigital transducer CE22, and (d) the resistor R22a is arranged between the other end (second end) of the input signal source IS and the third interdigital transducer CE23 while the resistor R21b is arranged between the other end (second end) of the input signal source IS and the fourth interdigital transducer CE24.

On the premise of the configuration as above, (A1) the resistance values of the resistors R21a and R21b are made to be 0 (zero) while the resistance values of the resistors R22a and R22b are made to be larger than a critical resistance value Rc, making the wiring equal to that of the first state described above. Consequently, the resonance signal Sout (S0) having the first frequency f1 is generated.

Further, (A2) the resistance values of the resistors R22a and R22b are made to be 0 (zero) while the resistance values of the resistors R21a and R21b are made to be larger than the critical resistance value Rc, making the wiring equal to that of the second state described above. Consequently, the resonance signal Sout (A0) having the second frequency f2 is generated.

Furthermore, (A3) the four resistance values for the resistors R21a, R21b, R22a, and R22b are made to be larger than a critical resistance value Rc, making the wiring equal to that of the third state described above. Consequently, the resonance signal Sout (S0+A0) having the third frequency f3 is generated.

[Third Modification]

Unlike the second modification described above, but similarly to the third modification in the first embodiment, compared to (A1) described above, (B1) while the resistance values of the resistors R21a and R21b are made to be 0 (zero), the resistance values of the resistors R22a and R22b are not made to be larger than the critical resistance value Rc, but changed within a range of the value from 0 (zero) to the critical resistance value Rc. Consequently, a resonance signal having the fourth frequency f4 (illustrated in FIG. 6) in a range from the first frequency f1 to the third frequency f3 is generated. Further, compared to (A2) described above, (B2) while the resistance values of the resistors R22a and R22b are made to be 0 (zero), the resistance values of the resistors R21a and R21b are not made to be larger than the critical resistance value Rc, but changed within a range of the value from 0 (zero) to the critical resistance value Rc. Consequently, a resonance signal having the fifth frequency f5 (illustrated in FIG. 6) in a range from the second frequency f2 to the third frequency f3 is generated.

Similarly to the surface acoustic wave device SDEV1 provided with the surface acoustic wave element SD1 in the first embodiment and the oscillator OSC1, the surface acoustic wave element SD20 in the third embodiment, the first switch SW1, the second switch SW2, terminals T20a and T20b are formed, configuring the surface acoustic wave device in the third embodiment (not shown). In addition, the surface acoustic wave device in the second embodiment (more specifically the surface acoustic wave device in the second embodiment, which includes the switch unit SWU instead of the switch SW1 and the switch SW2) and the inverter IN, configuring an oscillator in the third embodiment (not shown).

Fourth Embodiment

Figure 15:
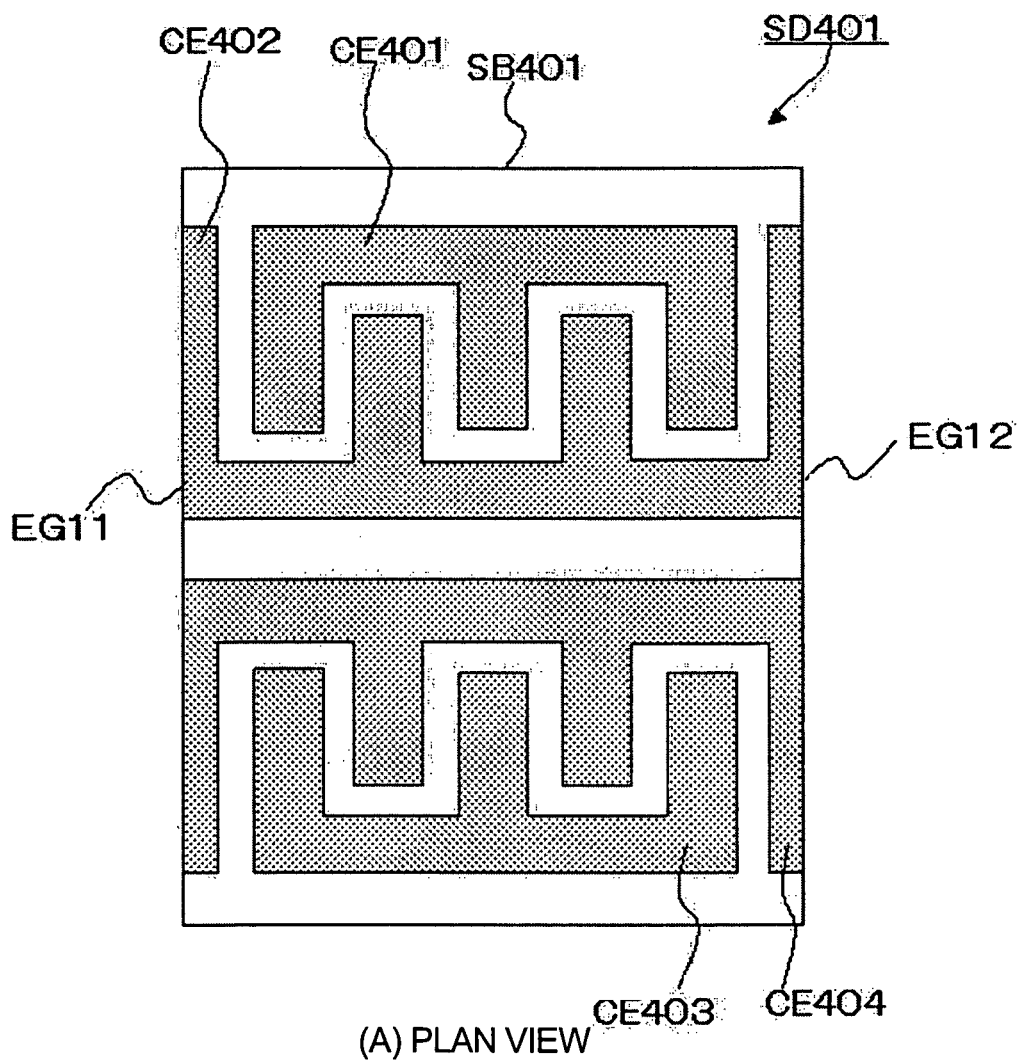
FIGS. 15A and 15B are diagrams showing a first configuration of a surface acoustic wave element according to a fourth embodiment.
Figure 15:
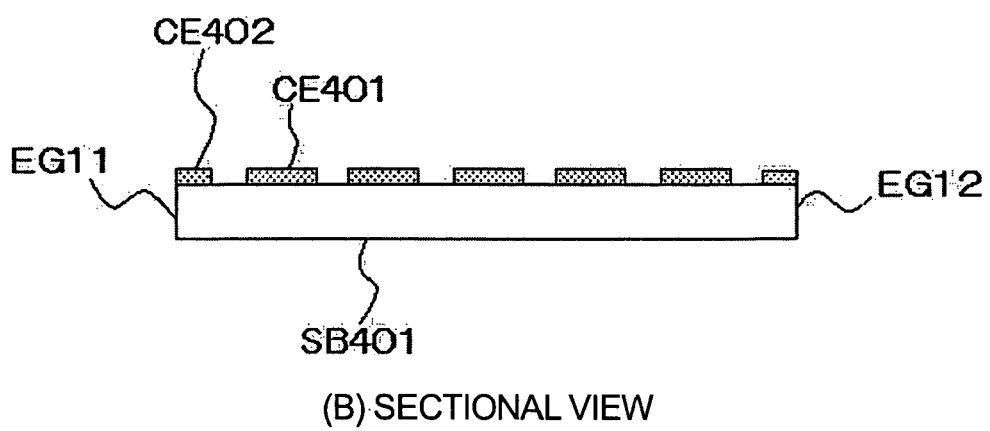

In the surface acoustic wave element according to the first embodiment through the third embodiment, an edge reflection can be employed instead of the reflectors. FIG. 15A is a plan view of a surface acoustic wave element SD401 according to a fourth embodiment, while FIG. 15B is a sectional view thereof. The surface acoustic wave element SD401 includes edges EG11 and EG12 formed on a piezoelectric substrate SB401. As shown in FIG. 15B, the edges EG11 and EG12 are side faces of the piezoelectric substrate SB401 opposing to each other in a propagation direction of a surface acoustic wave. The edges EG11 and EG12 are formed in a position to sandwich a first interdigital transducer unit formed with CE401 and CE402, and a second interdigital transducer unit formed with CE403 and CE404. The edges EG11 and EG12 reflect a surface acoustic wave excited at the first and second interdigital transducer units.

Figure 16:
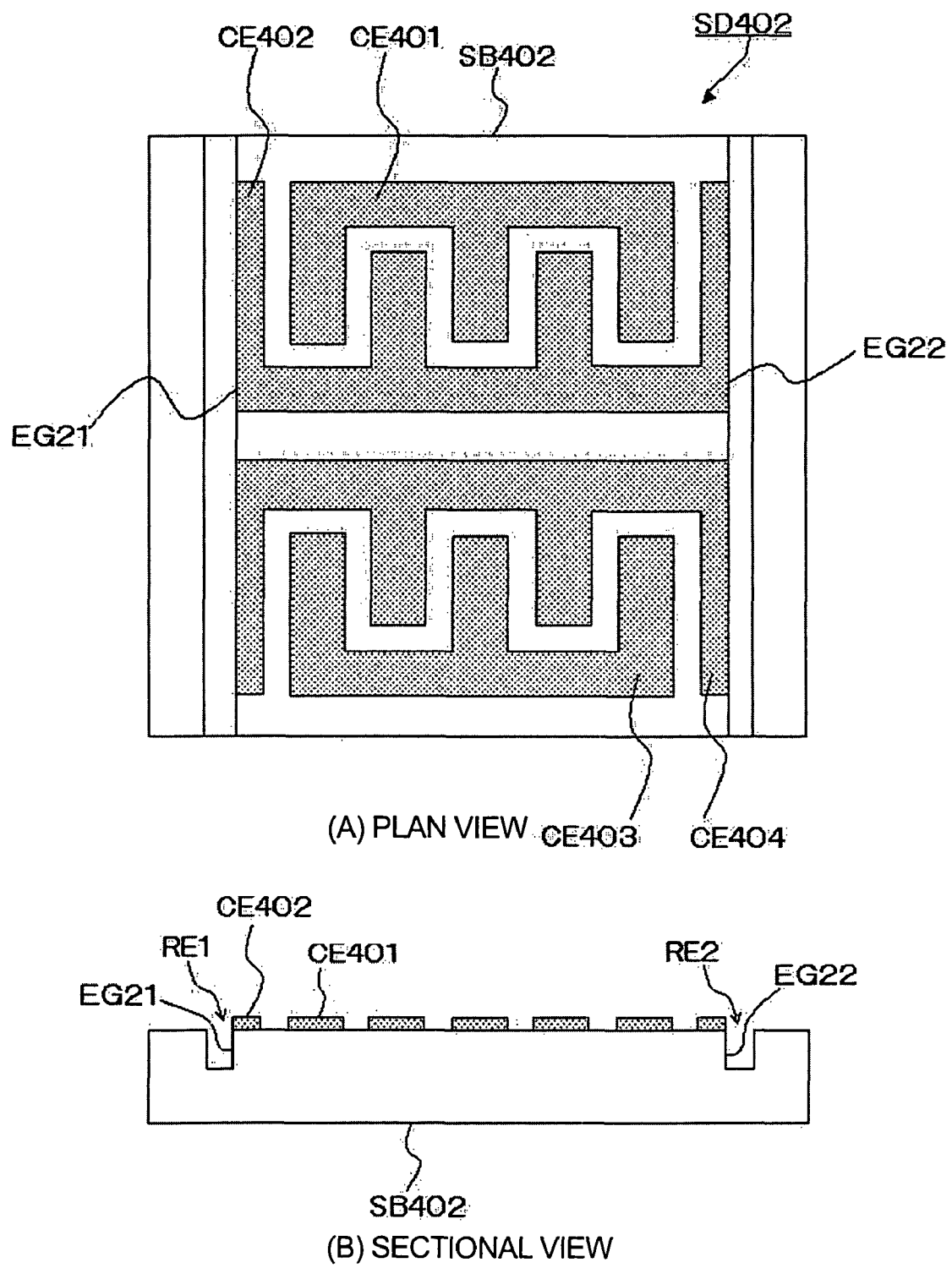
FIGS. 16A and 16B are diagrams showing a second configuration of the surface acoustic wave element according to the fourth embodiment.

Alternatively, when the edge reflection is employed, a configuration shown in FIGS. 16A and 16B is also possible. That is, the surface acoustic wave element SD402 includes a piezoelectric substrate SB402 having recesses RE1 and RE2 formed therein. Then, an edge EG21 of the recess RE1 and an edge EG22 of the recess RE2 can be used as edges reflecting a surface acoustic wave.

Figure 17:
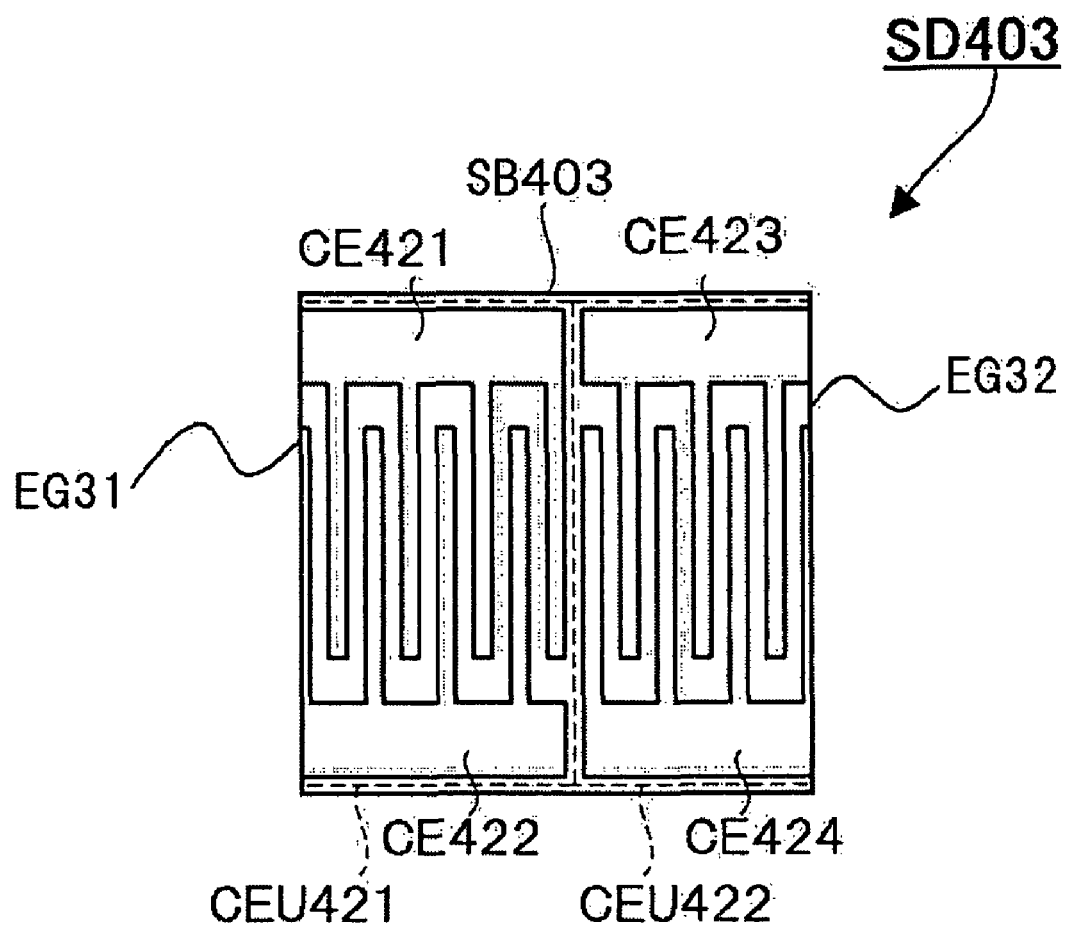
FIG. 17 is a diagram showing a third configuration of the surface acoustic wave element according to the fourth embodiment.

Further, the edge reflection is also applicable to a cascade connected surface acoustic wave element. A surface acoustic wave element SD403 shown in FIG. 17 is provided with a piezoelectric substrate SB403 having edges EG31 and EG32 formed thereon. The edges EG31 and EG32 are formed in a position to sandwich a first interdigital transducer unit CEU421 and a second interdigital transducer unit CEU422. The edges EG31 and EG32 reflect a surface acoustic wave excited at the first interdigital transducer unit CEU421 and the second interdigital transducer unit CEU422.

The edge reflection type surface acoustic wave elements SD401, SD402, and SD403 as above enable reduction in planar size since reflectors are not required to be formed.

Fifth Embodiment

Figure 18:
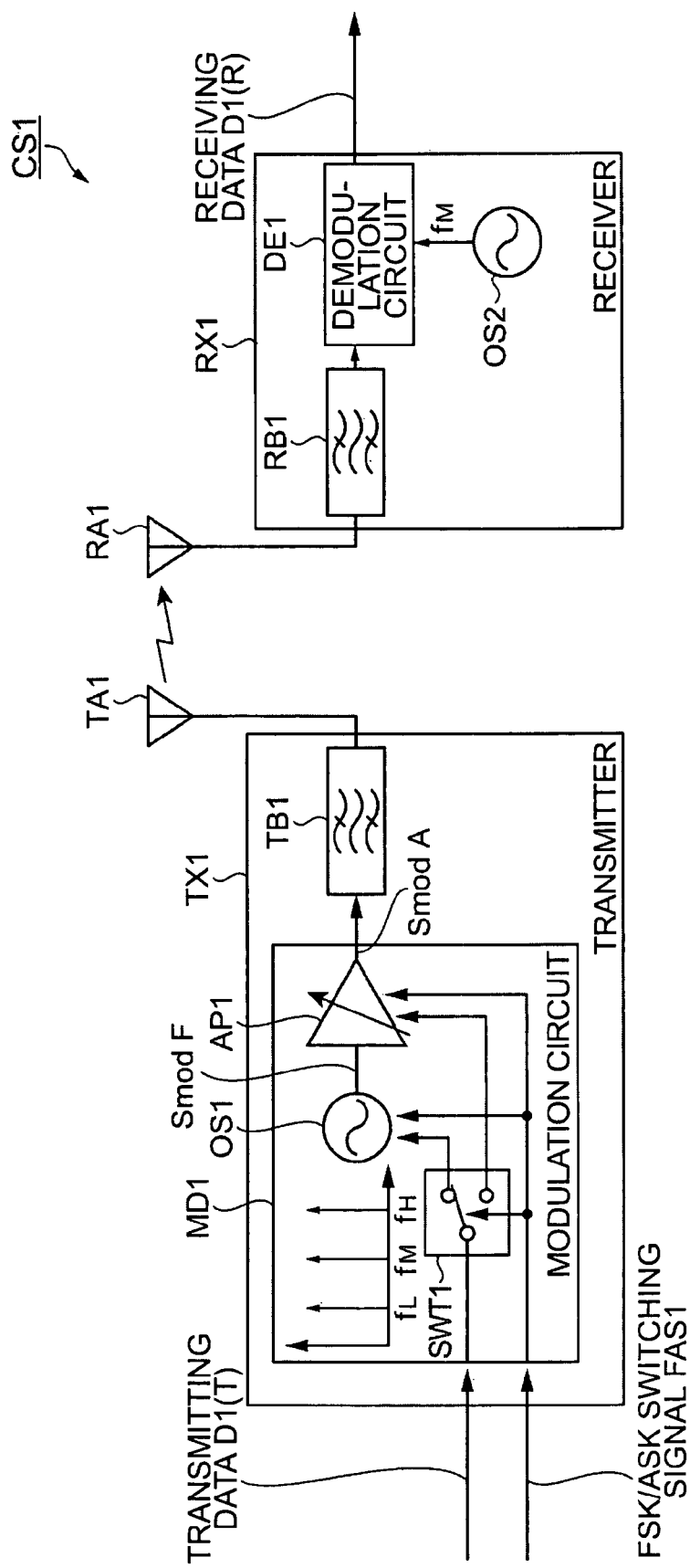
FIG. 18 is a diagram showing a communication system according to a fifth embodiment.

FIG. 18 shows a configuration of a communication system according to a fifth embodiment. As shown in FIG. 18, a communication system CS1 according to the fifth embodiment includes a transmitter TX1, a transmitting antenna TA1, a receiving antenna RA1, and receiver RX1 so as to transmit and receive a transmitting data signal D1(T) that is a digital signal in a base band required to transmit in accordance with a FSK/ASK switching signal FAS1. The FSK/ASK switching signal FAS1 determines a communication system to transmit or receive the signal between an FSK communication system and an ASK communication system. In the FSK communication system, a first frequency fL and a second frequency fH are used while a third frequency fM positioned between the first frequency fL and the second frequency fH is used in the ASK communication system.

The transmitter TX1 includes a modulation circuit MD1, and a transmission band filter TB1. Further, the modulation circuit MD1 is provided with an oscillator OS1, an amplifier circuit AP1, and a switch SWT1. On the other hand, the receiver RX1 includes a reception band filter RB1, a demodulation circuit DE1, and an oscillator OS2. The oscillator OS1 is the oscillator OSC1 shown in FIG. 8.

In the modulation circuit MD1, in a case of the FSK communication system, the oscillator OS1 generates a carrier wave having the first frequency fL or the second frequency fH in response to that the transmitting data signal D1(T) is 0 (zero) or 1 (one). More specifically, when the transmitting data signal D1(T) is 0 (zero), a first carrier wave having the first frequency fL is generated, while when the transmitting data signal D1(T) is 1 (one), a second carrier wave having the second frequency fH is generated. Accordingly, the modulation circuit MD1 is provided with a frequency modulation circuit forming a modulation signal SmodF.

Further, in the modulation circuit MD1, in a case of the ASK communication system, the amplifier circuit AP1 converts an amplitude of the third carrier wave having the third frequency fM generated by the oscillator OS1 to 0 (zero) or 1 (one) in response to 0 (zero) or 1 (one) of the transmitting data signal D1(T). More specifically, when the transmitting data signal D1(T) is 0 (zero), the amplitude of the third carrier wave is made to be 0 (zero), while when the transmitting data signal D1(T) is 1 (one), the amplitude of the third carrier wave is made to be 1 (one). Accordingly, the modulation circuit MD1 is provided with an amplitude modulation circuit forming a modulation signal SmodA.

The switch SWT1 outputs the transmitting data signal D1(T) to the oscillator OS1 or the amplifier circuit AP1 in accordance with the FSK/ASK switching signal FAS1 that indicates the FSK communication system or the ASK communication system being selected as described above.

In the receive RX1, the reception band filter RB1 filters the modulation signal SmodF or the modulation signal SmodA. The demodulation circuit DE1 demodulates the filtered modulation signal SmodF or SmodA in accordance with the third carrier wave generated by the oscillator OS2.

A passband of the transmitting band fileter TB1 is generally arranged in a range between fL and fH due to an S/N improvement or the like. In the transmitter TX1 according to the fifth embodiment, the third frequency fM that is a frequency of the modulation signal SmodA is positioned between the first frequency fL and the second frequency fH, which are frequencies of the modulation signal SmodF. According to the above, it is prevented that a part of the modulation signal SmodA of the second frequency fH in the ASK communication system cannot pass through the transmitting band filters TB10 and RB10 due to frequency variation caused by temperature change.

Sixth Embodiment

Figure 19:
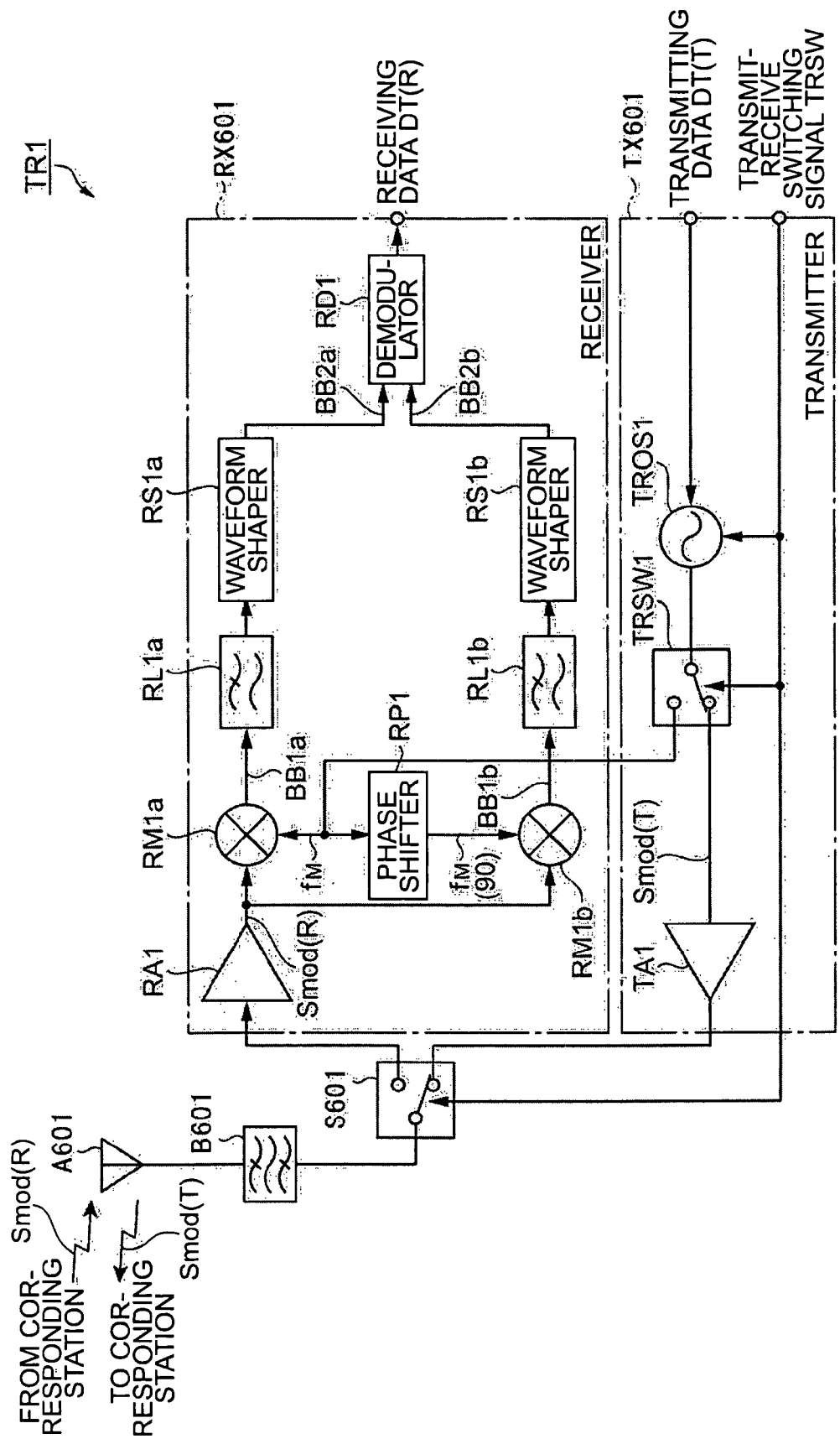
FIG. 19 is a diagram showing a configuration of an FSK transceiver according to a sixth embodiment.
Figure 20:
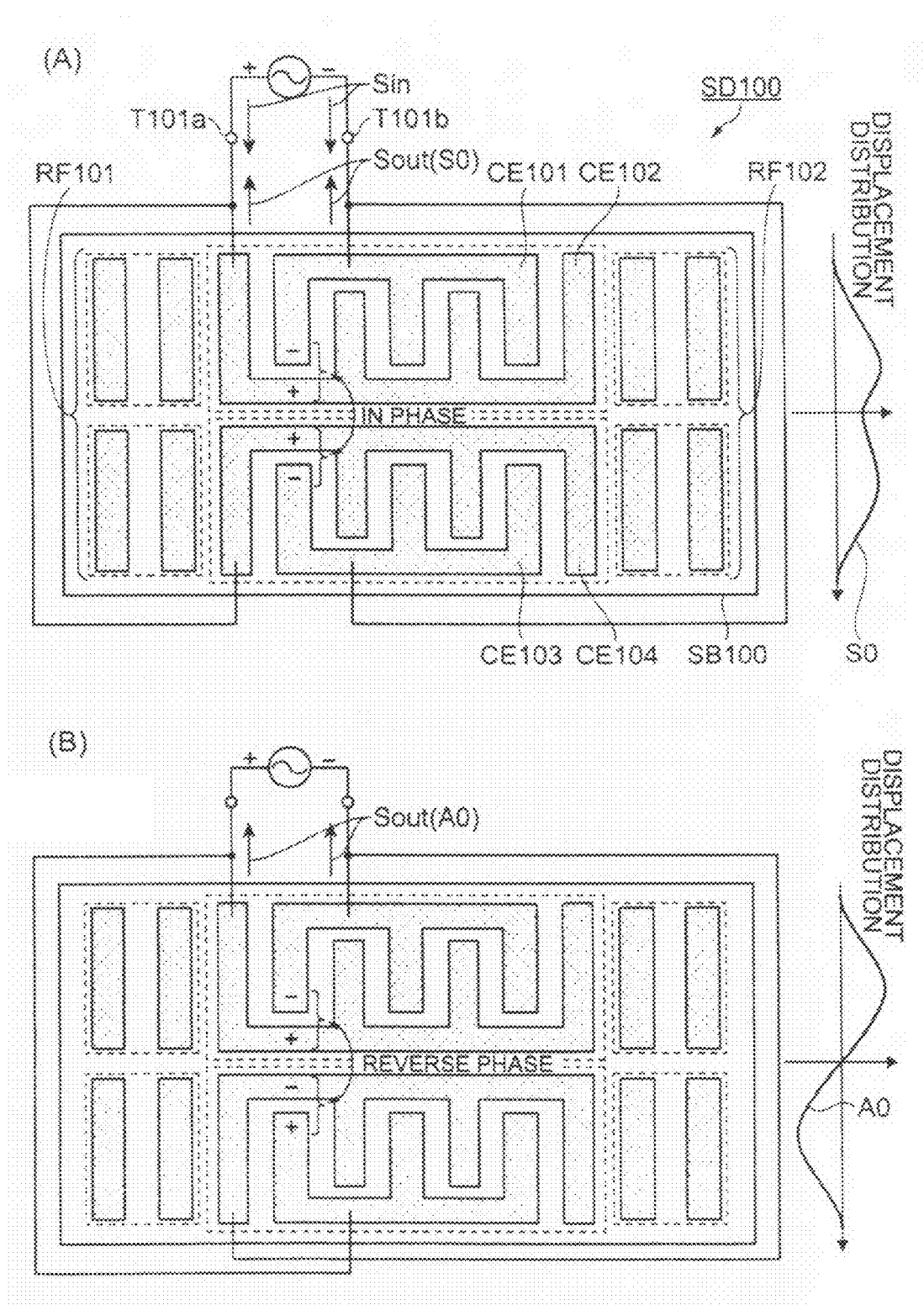
FIGS. 20A and 20B are diagrams showing configurations of a surface acoustic wave element in related art and usage thereof.

FIG. 19 shows a configuration of an FSK transceiver according to a sixth embodiment. An FSK transceiver TR1 according to the sixth embodiment is, for example, formed on a car and a key that a user carries for a keyless entry system of an automobile. As shown in FIG. 19, the FSK transceiver TR1 includes a transmitter TX601, a receiver RX601, a switch S601, a band filter B601, and an antenna A601 so as to perform orthogonal detection.

The transmitter TX601 includes an oscillator TROS1, a switch TRSW1, and an amplifier TA1. To be precise, the oscillator TROS1 is used by both of the transmitter TX601 and the receiver RX601.

The oscillator TROS1 is the oscillator OSC1 shown in FIG. 8. The oscillator TROS1 oscillates in accordance with a transmit-receive switching signal TRSW that designates an operation of the oscillator TROS1 as a transmitter or a receiver. More specifically, when "transmitter" is designated, the first carrier wave having the first frequency fL and the second carrier wave having the second frequency fH are generated. Further, when "receiver" is designated, the third carrier wave having the third carrier wave fM between the first frequency fL and the second frequency fH is generated for demodulation by orthogonal detection. In the embodiment, the third frequency fM is in the middle (median) between the first frequency fL and the second frequency fH.

In a case of transmission, the oscillator TROS1 outputs carrier waves of the first frequency fL and the second frequency fH in response to 0 (zero) or 1 (one) of a transmitting data signal DT(T). More specifically, when the transmitting data signal DT(T) is 0 (zero), the first carrier wave having the first frequency fL is generated, while when the transmitting data signal DT(T) is 1 (one), the second carrier wave having the second frequency fH is generated so as to form a modulation signal Smod(T).

The switch TRSW1 is, for example, formed with a field-effect transistor (FET) as a switching element. In accordance with the transmit-receive switching signal TRSW, the switch TRSW1 outputs the modulation signal Smod (T) being output from the oscillator TROS1 to the amplifier TA1 subsequently coupled thereto. Alternatively, the switch TRSW1 outputs the third carrier wave having the third frequency fM being output from the oscillator TROS1 to a first multiplier RM1$a$ and a phase shifter RP1 in the receiver RX601.

The amplifier TA1 is, for example, formed with a field-effect transistor as an amplifying element. On receiving the modulation signal Smod(T) from the switch TRSW1, the amplifier TA1 amplifies the modulation signal Smod (T) only at a constant (fixed) gain.

The switch S601 couples the band filter B601 and the antenna A601 to the transmitter TX601 or the receiver RX601 in accordance with the transmit-receive switching signal TRSW.

The band filter B601 used in common between transmission and reception allows the modulation signal Smod(T) from the transmitter TX601 to pass through and allows the modulation signal Smod(R) received by the antenna A601 from a corresponding station to pass through.

The antenna A601 also used in common between transmission and reception is, for example, a loop antenna formed on a circuit substrate (not shown). The antenna A601 transmits the modulation signal Smod(T) to the corresponding station and receives the modulation signal Smod(R) from the corresponding station.

Next, the receiver will be explained.

The receiver RX601 includes an amplifier RA1, the multiplier RM1$a$ and a multiplier RM1$b$, the phase shifter RP1, low-band filters RL1$a$ and RL1$b$, waveform shapers RS1$a$ and RS1$b$, and a demodulator RD1.

The amplifier RA1 is a low-noise amplifier circuit formed with a field-effect transistor as an amplifying element. The amplifier RA1 amplifies the modulation signal Smod(R) received through the antenna A1 and the band filter B1.

The multipliers RM1$a$ and RM1$b$ are mixers such as so-called double balanced mixers (DBM). The multiplier RM1$a$ generates a base band signal BB1$a$ by multiplying the modulation signal Smod(R) from the amplifier RA1 and the third carrier wave having the third frequency fM from the oscillator TROS1. On the other hand, the multiplier RM1$b$ generates a base band signal BB1$b$ by multiplying the modulation signal Smod(R) from the amplifier RA1, and the third carrier wave of the third frequency fM(90) that is phase-shifted at 90 degrees at the phase shifter RP1.

The low-band filters RL1$a$ and RL1$b$ let the base band signals BB1$a$ and BB1$b$ pass through.

The waveform shapers RS1$a$ and RS1$b$ shape waveforms of the base band signals BB1$a$ and BB1$b$. More specifically, after being amplified, the base band signals BB1a and BB1b are shaped in from analog waveforms to digital waveforms based on a predetermined threshold so as to generate the base band signals BB2a and BB2b.

The demodulator RD1 is, for example, formed with a D-type flip flop. By orthogonal detection using the base band signals BB2a and BB2b, a receiving data signal DT(R) that is identical with the transmitting data signal DT(T) is regenerated.

In the FSK transceiver TR1 according to the sixth embodiment, the transmitter TX1 and the receiver RX1 share the first carrier wave having the first frequency fL and the second carrier wave having the second frequency fH for transmission, and the oscillator TROS1 that is capable of generating the third carrier wave having the third frequency fM for reception. Therefore, compared to a transceiver requiring two or more of oscillators in related art, the FSK transceiver TR1 enables down-sizing and cost reduction thereof.

The entire disclosure of Japanese Patent Application Nos: 2006-321245, filed Nov. 29, 2006, 2006-323086, filed Nov. 30, 2006 and 2006-323087, filed Nov. 30, 2006 are expressly incorporated by reference herein.

What is claimed is:

1. A surface acoustic wave device, comprising:
a surface acoustic wave element, including:
  a piezoelectric substrate;
  a first interdigital transducer unit having a first interdigital transducer and a second interdigital transducer formed on the piezoelectric substrate; and
  a second interdigital transducer unit having a third interdigital transducer and a fourth interdigital transducer formed on the piezoelectric substrate;
a first terminal electrically coupled to the first interdigital transducer;
a second terminal electrically coupled to the second interdigital transducer;
a first variable resistor electrically coupling the first terminal to the third interdigital transducer;
a second variable resistor electrically coupling the first terminal to the fourth interdigital transducer;
a third variable resistor electrically coupling the second terminal to the third interdigital transducer; and
a fourth variable resistor electrically coupling the second terminal to the fourth interdigital transducer.

2. The surface acoustic wave device according to claim 1 further comprising
a switching unit, the switching unit switching among a first state, a second state, and a third state, wherein the first state is that a resistance value of the first variable resistor and a resistance value of the fourth variable resistor are made to be substantially zero, while a resistance value of the second variable resistor and a resistance value of the third variable resistor are made to be larger than zero so as to make a resonance frequency of the surface acoustic wave element be a first frequency, and the second state is that the resistance value of the first variable resistor and the resistance value of the fourth variable resistor are made to be larger than zero, while the resistance value of the second variable resistor and the resistance value of the third variable resistor are made to be substantially zero so as to make the resonance frequency of the surface acoustic wave element be a second frequency, while the third state is that the resistance value of the first variable resistor, the resistance value of the second variable resistor, the resistance value of the third variable resistor, and the resistance value of the fourth variable resistor are made to be larger than zero so as to make the resonance frequency of the surface acoustic wave element be a third frequency.

3. The surface acoustic wave device according to claim 1 further comprising a switching unit, the switching unit switching among a fourth state, a fifth state, and a sixth state, wherein the fourth state is that a resistance value of the first variable resistor and a resistance value of the fourth variable resistor are made to be substantially zero, while a resistance value of the second variable resistor and a resistance value of the third variable resistor are made to be larger than a critical resistance value so as to make a resonance frequency of the surface acoustic wave element be a first frequency, and the fifth state is that the resistance value of the first variable resistor and the resistance value of the fourth variable resistor are made to be larger than the critical resistance value, while the resistance value of the second variable resistor and the resistance value of the third variable resistor are made to be substantially zero so as to make the resonance frequency of the surface acoustic wave element be a second frequency, while the sixth state is that the resistance value of the first variable resistor, the resistance value of the second variable resistor, the resistance value of the third variable resistor, and the resistance value of the fourth variable resistor are made to be larger than the critical resistance value so as to make the resonance frequency of the surface acoustic wave element be a third frequency.

4. The surface acoustic wave device according to claim 1, further comprising one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

5. A surface acoustic wave device, comprising:
a surface acoustic wave element, including:
  a piezoelectric substrate;
  a first interdigital transducer unit having a first interdigital transducer and a second interdigital transducer formed on the piezoelectric substrate; and
  a second interdigital transducer unit having a third interdigital transducer and a fourth interdigital transducer formed on the piezoelectric substrate;
a first terminal electrically coupled to the first interdigital transducer and the fourth interdigital transducer;
a second terminal electrically coupled to the second interdigital transducer and the third interdigital transducer;
a first resistance element interposed between only the first terminal and only one of the third interdigital transducer and the fourth interdigital transducer;
a second resistance element interposed between only the second terminal and only one of either:
  the fourth interdigital transducer if the first resistance element is interposed between the first terminal and the third interdigital transducer, or
  the third interdigital transducer if the first resistance element is interposed between the first terminal and the fourth interdigital transducer.

6. The surface acoustic wave device according to claim 5, further comprising one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

7. A surface acoustic wave device, comprising:
   a surface acoustic wave element, including:
      a piezoelectric substrate;
      a first interdigital transducer unit having a first interdigital transducer and a second interdigital transducer formed on the piezoelectric substrate; and
      a second interdigital transducer unit having a third interdigital transducer and a fourth interdigital transducer formed on the piezoelectric substrate;
   a first terminal;
   a second terminal;
   a first switch electrically coupling the first terminal to one of the third interdigital transducer, the fourth interdigital transducer, and an open end;
   a second switch electrically coupling the second terminal to one of the fourth interdigital transducer, the third interdigital transducer, and an open end;
   a switch controller controlling the first switch and the second switch so as to be in one of a seventh state, an eighth state, and a ninth state, wherein the seventh state is that the first switch electrically couples the first terminal to the third interdigital transducer while the second switch electrically couples the second terminal to the fourth interdigital transducer, and the eighth state is that the first switch electrically couples the first terminal to the fourth interdigital transducer while the second switch electrically couples the second terminal to the third interdigital transducer, while the ninth state in which the first switch couples the first terminal to the open end while the second switch couples the second terminal to the open end.

8. The surface acoustic wave device according to claim 7 further comprising one of a pair of reflectors formed in a position sandwiching the first interdigital transducer unit and the second interdigital transducer unit on the piezoelectric substrate and reflecting a surface acoustic wave, and a pair of edges formed in a position sandwiching the first interdigital transducer unit and the second interdigital transducer unit of the piezoelectric substrate and reflecting the surface acoustic wave.

9. A transmitter including the surface acoustic wave device according to claim 7, comprising:
   an oscillator including the surface acoustic wave device and an amplifier coupled to the first terminal and the second terminal of the surface acoustic wave device;
   a frequency modulation circuit switching between the seventh state and the eighth state by the switch controller of the surface acoustic wave device based on a transmitting data signal, and receiving a resonance signal of the oscillator and outputting a frequency modulation signal; and
   an amplitude modulation circuit switching the first switch and the second switch to be in the ninth state by the switch controller of the surface acoustic wave device, and receiving the resonance signal being output from the oscillator and outputting an amplitude modulation signal by modulating an amplitude based on the transmitting data signal.

10. A transceiver including the surface acoustic wave device according to claim 7, comprising:
   an oscillator including the surface acoustic wave device and an amplifier coupled to the first terminal and the second terminal of the surface acoustic wave device;
   a frequency modulation circuit switching between the seventh state and the eighth state by the switch controller of the surface acoustic wave device based on a transmitting data signal, and receiving a resonance signal of the oscillator and outputting a frequency modulation signal; and
   an orthogonal detector circuit switching the first switch and the second switch to be in the ninth state by the switch controller of the surface acoustic wave device, and receiving the resonance signal being output from the oscillator and outputting a demodulation signal by orthogonal detection based on a receiving data signal.

* * * * *